(12) United States Patent
Rocci et al.

(10) Patent No.: US 11,218,003 B2
(45) Date of Patent: Jan. 4, 2022

(54) METHOD AND APPARATUS FOR INTELLIGENT BATTERY CHARGE EQUALIZATION AND MONITORING

(75) Inventors: Joseph D. Rocci, Lansdale, PA (US); Michael L. Quelly, Quakertown, PA (US)

(73) Assignee: PHOENIX BROADBAND TECHNOLOGIES, LLC, Hatfield, PA (US)

(*) Notice: Subject to any disclaimer, the term of this patent is extended or adjusted under 35 U.S.C. 154(b) by 1041 days.

(21) Appl. No.: 12/888,181

(22) Filed: Sep. 22, 2010

(65) Prior Publication Data

US 2011/0068746 A1 Mar. 24, 2011

Related U.S. Application Data

(60) Provisional application No. 61/244,620, filed on Sep. 22, 2009.

(51) Int. Cl.
*H02J 7/00* (2006.01)
*G01R 31/389* (2019.01)
(Continued)

(52) U.S. Cl.
CPC ......... *H02J 7/0016* (2013.01); *H01M 10/441* (2013.01); *H02J 13/0062* (2013.01); *H02J 13/0075* (2013.01); *H02J 13/0079* (2013.01); *H02J 13/0086* (2013.01); *G01R 31/389* (2019.01); *H01M 10/06* (2013.01); *Y02E 60/00* (2013.01); *Y04S 10/30* (2013.01)

(58) Field of Classification Search
CPC ............... H02J 7/0016; H02J 13/00002; H02J 13/00016; H02J 13/00024; H02J 13/00026; H02J 13/00028; H02J 13/0062; H02J 13/0075; H02J 13/0079; H02J 13/0086; G01R 31/3658; G01R 31/389; H01M 10/06; H01M 10/441; Y02E 60/00; Y02E 60/10; Y02S 10/30
USPC ................................................. 320/122, 118
See application file for complete search history.

(56) References Cited

U.S. PATENT DOCUMENTS 4,336,314 A * 6/1982 Yonezu ............... H01M 2/0242
429/145
4,433,294 A * 2/1984 Windebank .......... G01R 31/385
324/426
(Continued)

FOREIGN PATENT DOCUMENTS

DE 102004013351 A1 10/2005
DE 10 2008 016957 10/2009
(Continued)

*Primary Examiner* — Richard Isla
*Assistant Examiner* — Johali A Torres Ruiz
(74) *Attorney, Agent, or Firm* — Steven J. Rocci P.C.

(57) ABSTRACT

An intelligent battery charge equalization and monitoring system may assist in the management of battery string health by detecting individual batteries within a string that may need servicing. The system may detect a battery within a string that is charged to a higher voltage than other batteries within the string and discharge the overcharged battery until the battery's charge is equalized with the other batteries in the string. The system may use metrics related to how often individual batteries within a string of batteries must be equalized and utilize these metrics to perform maintenance actions.

31 Claims, 14 Drawing Sheets

(51) Int. Cl.
*H01M 10/44* (2006.01)
*H02J 13/00* (2006.01)
*H01M 10/06* (2006.01)

(56) References Cited

U.S. PATENT DOCUMENTS

| | | | |
|---|---|---|---|
| 4,563,628 A * | 1/1986 | Tietz et al. | 320/163 |
| 4,885,523 A | 12/1989 | Koenck | |
| 4,965,738 A | 10/1990 | Bauer et al. | |
| 5,119,011 A | 6/1992 | Lambert | |
| 5,504,415 A * | 4/1996 | Podrazhansky | H02J 7/0016 320/118 |
| 5,606,242 A | 2/1997 | Hull et al. | |
| 5,666,040 A | 9/1997 | Bourbeau | |
| 5,862,515 A | 1/1999 | Kobayashi et al. | |
| 5,869,949 A | 2/1999 | Nishikawa et al. | |
| 5,936,385 A | 8/1999 | Patillon et al. | |
| 6,005,367 A | 12/1999 | Rohde | |
| 6,081,095 A * | 6/2000 | Tamura et al. | 320/118 |
| 6,137,267 A | 10/2000 | Kates et al. | |
| 6,198,253 B1 | 3/2001 | Kurle et al. | |
| 6,239,579 B1 * | 5/2001 | Dunn | G01R 31/3658 320/119 |
| 6,271,643 B1 | 8/2001 | Becker et al. | |
| 6,307,349 B1 | 10/2001 | Koenck et al. | |
| 6,404,166 B1 | 6/2002 | Puchianu | |
| 6,504,344 B1 | 1/2003 | Adams et al. | |
| 6,532,425 B1 | 3/2003 | Boost et al. | |
| 6,583,603 B1 | 6/2003 | Baldwin | |
| 6,611,774 B1 | 8/2003 | Zaccaria | |
| 6,936,995 B2 | 8/2005 | Kapsokavathis et al. | |
| 6,983,212 B2 | 1/2006 | Burns | |
| 7,166,384 B2 | 1/2007 | LaFollette et al. | |
| 7,173,397 B2 | 2/2007 | Kinoshita et al. | |
| 7,256,695 B2 | 8/2007 | Hamel et al. | |
| 7,557,539 B2 | 7/2009 | Takagi et al. | |
| 7,710,119 B2 | 5/2010 | Bertness | |
| 7,728,552 B2 | 6/2010 | Burns | |
| 7,970,560 B2 | 6/2011 | Rocci et al. | |
| 8,032,316 B2 | 10/2011 | Rocci et al. | |
| 8,044,815 B2 | 10/2011 | Du et al. | |
| 8,054,034 B2 * | 11/2011 | Lim | H02J 7/0016 320/101 |
| 8,204,702 B2 | 6/2012 | Center | |
| 8,350,529 B2 * | 1/2013 | Loncarevic | H02J 7/0016 320/118 |
| 8,558,712 B2 | 10/2013 | Fechalos et al. | |
| 8,829,857 B2 | 9/2014 | Minamiura | |
| 2003/0076250 A1 | 4/2003 | Enochson et al. | |
| 2003/0094928 A1 | 5/2003 | Emori et al. | |
| 2005/0038614 A1 | 2/2005 | Botts et al. | |
| 2005/0099162 A1 * | 5/2005 | Ding | H02J 7/00711 320/141 |
| 2005/0156559 A1 * | 7/2005 | Thibedeau | G01R 31/389 320/106 |
| 2005/0252546 A1 | 11/2005 | Sasaki | |
| 2006/0152190 A1 | 7/2006 | Riemschneider | |
| 2008/0143292 A1 | 6/2008 | Ward | |
| 2008/0197808 A1 | 8/2008 | Banta et al. | |
| 2008/0252257 A1 * | 10/2008 | Sufrin-Disler | B60L 3/0046 320/118 |
| 2008/0258683 A1 * | 10/2008 | Chang | 320/112 |
| 2010/0052615 A1 * | 3/2010 | Loncarevic | H02J 7/0016 320/118 |
| 2010/0237702 A1 * | 9/2010 | Stocker | H02J 9/065 307/66 |
| 2010/0281183 A1 | 11/2010 | Van Bebber | |
| 2011/0288798 A1 | 11/2011 | Rocci et al. | |
| 2012/0022817 A1 | 1/2012 | Rocci et al. | |

FOREIGN PATENT DOCUMENTS

| | | |
|---|---|---|
| JP | 63-124732 | 5/1988 |
| JP | 2005-328642 | 11/2005 |
| JP | 2009-303308 | 12/2009 |
| JP | 2010-195065 | 9/2010 |
| WO | WO 2005/091461 A1 | 9/2005 |
| WO | WO 2007/044872 | 4/2007 |

* cited by examiner

METHOD AND APPARATUS FOR INTELLIGENT BATTERY CHARGE EQUALIZATION AND MONITORING

CROSS REFERENCE TO RELATED APPLICATIONS

This application claims the benefit of U.S. Provisional Patent Application Ser. No. 61/244,620, filed Sep. 22, 2009, which was incorporated herein by reference in its entirety.

BACKGROUND

Because commercial AC power is not always reliable enough for telecommunication systems and mission critical business information systems, it is common to provide backup power in the event of a failure of the commercial feed. The backup power is typically provided by a collection of power sources or electrochemical batteries, known as a battery plant. The batteries may be located within an uninterruptable power supply (UPS) or centrally located within the site and coupled with power distribution bars, to feed DC equipment, and inverters, to feed AC equipment. Regardless of where the batteries are located, they are often oriented in groups, wired in series up to the required voltage.

Battery cells or battery monoblocs are often installed as a stationary string of identical cells in order to achieve a higher voltage to operate the equipment which they power. Examples of installations of stationary battery strings include, but are not limited to, Cable TV headends and outside plant power, wireless cell sites, wireline central offices, data centers, power distribution stations, alternative energy generation systems and many other applications.

However, no two batteries, even of the same brand and model, are identical. Minor variations in the electrochemistry process result in each battery having very slight variations in open-circuit terminal voltage and internal resistance. These differences may present difficulties and shortened lifespan of batteries when charged as part of a string.

SUMMARY

According to one embodiment as described herein, a voltage characteristic for a plurality of batteries may be received at a central site controller. For example, a voltage characteristic may be received for each battery in a charging string of batteries at a central site controller. The voltage characteristic may include the voltage, current, temperature, internal admittance, or a similar indication of the voltage associated with a corresponding battery in the string of batteries. The central site controller may calculate a target voltage characteristic based on the voltage characteristics for each battery in the charging string of batteries. The central site controller may then send a discharge instruction to a sensor associated with a battery in the string of batteries based on the voltage characteristic of the battery and the target voltage characteristic. For example, the discharge instruction may be sent when a difference between the voltage characteristic associated with the battery and the target voltage characteristic reaches a predetermined threshold. The battery may then be discharged in accordance with the discharge instructions.

DETAILED DESCRIPTION

Figure 1A:
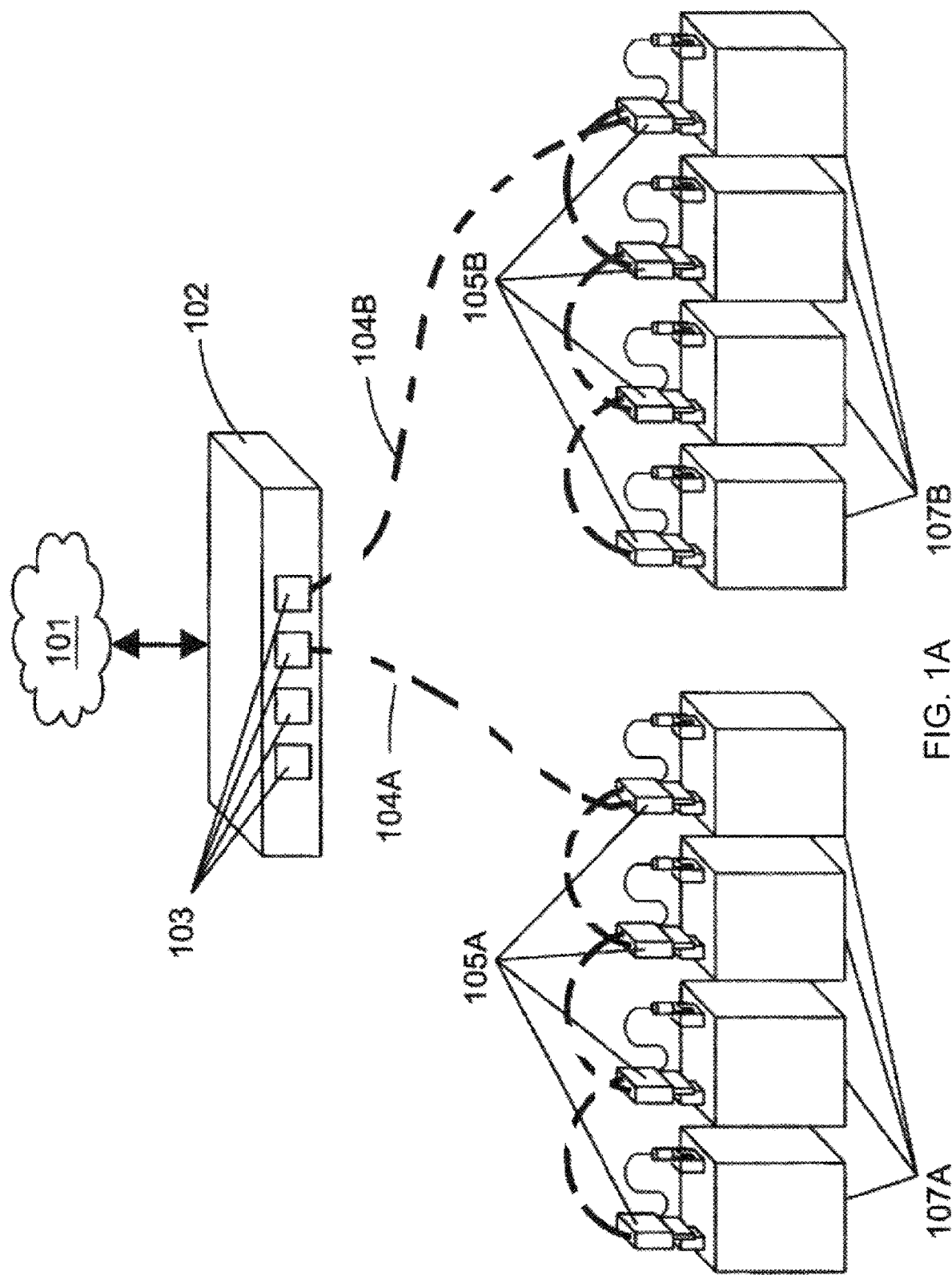
FIG. 1A depicts an example battery monitoring system.

The disclosed embodiments may include a system and method of equalizing and monitoring the amount of charge of individual batteries connected in a string of batteries managed by a string-level charging system. More specifically, the system and method may utilize battery monitoring sensors or equivalent circuitry in order to reduce the charge on overcharged batteries. As a result of the operation, the other batteries within the string may rise as a result of the operation of the string-level charging system.

The battery sensors may collect certain metrics of individual batteries within the string of batteries. One or more sensors may be connected to the batteries in such a fashion that the sensor(s) may collect metrics of the batteries within the string, including voltage, current, temperature, internal admittance and certain other attributes that can be correlated with performance and overall health of the batteries.

A site control unit may be in communication with the sensors by way of electrical communication cables, wireless transmission or some other means of communication. The site control unit may periodically poll all of the sensors that are electrically attached to it for the purpose of collecting measurement data and sending control commands to the sensors. The site control unit may also have an interface that allows it to be connected to a general purpose data network for purposes of interfacing with software systems that might make use of the sensor information as part of an overall battery population monitoring and management program. A single monitoring sensor device which monitors and manages multiple batteries may be used.

This site control unit may determine that a battery within a string of batteries is being charged to a higher voltage than a certain voltage threshold. This threshold may be defined by the average voltage of other batteries in the string at a point in time, the average voltage of the batteries in the string over a period of time, or any other appropriate voltage threshold.

The site control unit may also maintain the metrics collected from the sensors, such as the average total battery string voltage and individual battery voltage, in a storage medium. The site control unit may also communicate commands to the sensors to discharge current from the associated batteries. The site control unit may command the sensors or equivalent circuitry to discharge an overcharged battery at a designated current, for a designated duration, or until an overcharged battery has been discharged to a target voltage. The target discharge voltage may be equal to the voltage threshold for equalization or some other appropriate voltage.

The site control unit may also store information regarding how often individual batteries must be equalized to remain in alignment with the designated voltage target. A sensor may communicate to the site control unit a signal when the sensor discharges an unequalized battery or the site control unit may record how often the battery voltage communicated to the site control unit from the sensor is greater than a designated threshold voltage. This information may be used to determine which battery(s) within a string of batteries may need servicing or replacement. An alarm may indicate when the amount of times a battery must be equalized reaches a certain threshold. This threshold may be set or adjusted by the user. The alarm may be located at or near the battery in need of replacement or at some remote location such as the control unit or a remote operations center.

FIG. 1A depicts a battery monitoring system as described herein. One or more battery monitoring sensors 105A-B may be mechanically and/or electrically attached to the terminal posts of the monitored batteries 107A-B. Each respective battery sensor 105A-B may measure attributes of a respective battery 107A-B. Alternatively, a single battery sensor may measure attributes of multiple batteries 107A-B. The attributes may include the internal admittance (i.e., the inverse of impedance), the voltage, the current, the temperature, etc.

A site control unit 102 may be electrically attached to the battery sensors 105A-B by way of communication cables 104A-B. The communication cables 104A-B may allow the battery sensors 105A-B to communicate with the site control unit 102 and/or to independently communicate with one another. The communication cables 104A-B may be optional as site control unit 102 may be connected to the battery sensors 105A-B via a wireless channel and/or network including radio frequency (RF), optical, magnetic field induction, wireless mesh network of battery sensors 105A-B, a wireless local area network (WLAN), a wireless wide area network, or the like. For example, site control unit 102 and/or battery sensors 105A-B may communicate using Wi-Fi, Bluetooth, GSM, GPRS, WiMax, Zigbee, M2M technology, or similar wireless communication technology. The battery sensors 105A-B may communicate with the site control unit 102 and/or independently communicate with one another via a wireless transceiver or similar wireless communication means. The site control unit 102 may poll one or more of the battery sensors 105A-B periodically. The poll may collect measurement data from the sensors 105A-B and/or send control commands to the sensors 105A-B. The site control unit 102 may include a network interface. The network interface may enable connection to a general purpose data network 101 and/or the battery sensors 105A-B. The data network 101 may be an Internet Protocol (IP) network, or it may use another network protocol. The data network may employ T1, ISDN, DSL, broadband, Ethernet, WiFi, or other transport suitable for data transfer. The site control unit 102 may interface with software systems, via the data network 101. The software systems may use the sensor information as part of an overall battery population monitoring and management program. With this system, any number of batteries 107A-B may be monitored.

As shown, two strings of batteries 107A-B may be monitored by an exemplary remote battery monitoring system. Batteries 107A may be connected in series to form a first battery string. Likewise, batteries 107B may be connected in series to form a second battery string. Each battery 107A-B in each string may be connected to a series of sensors 105A-B. Each sensor 105A-B may have a "bolt on" form factor, such that the sensors 105A-B may be installed onto batteries 107A-B in existing strings. The sensors 105A-B may be manufactured to be part of the battery form factor. Each sensor 105A-B may be manufactured to be incorporated into a battery itself. For example, each sensor 105A-B may be incorporated into a respective battery of batteries 107A-B. Each sensor within the first string 107A may be interconnected via a communication cable 104A. Likewise, each sensor within the second string 107B may be interconnected via a communication cable 104B. Communication cables 104A-B may be four-conductor telephone cables or any other cable suitable for data transmission. Communication cables 104A-B may enable data communication between the sensors 105A-B and/or a site control unit 102. This communication may be serial and/or parallel data communication. Strings of sensors 105A-B may be connected to the site control unit 102. The site control unit 102 may include a number of interfaces 103 to support many communication cables 104A-B and, in turn, many batteries 107A-B under test. The site control unit 102 may be connected to a data network 101.

Each sensor 105A-B may test its respective battery 107A-B for data indicative of the battery's condition (e.g., admittance, temperature, voltage, etc.). Each sensor 105A-B may communicate the data indicative of the batteries condition to the site control unit 102. The site control unit 102 may subsequently perform mathematical calculations on the received data to report metrics indicative of battery condition. The site control unit may report the battery metrics via the data network 101. It may provide a regular report via File Transfer Protocol (FTP), Hypertext Transport Protocol (HTTP), and/or another protocol. It may provide the metrics as requested or polled by a user or management system via Simple Network Management Protocol (SNMP) and/or another protocol. The site control unit 102 may include a web server to display battery metrics and to receive management controls.

Each sensor 105A-B within a string may determine the total voltage of the respective string of batteries 107A-B. Each sensor 105A-B may measure voltages with respect to the string of batteries' overall voltage. This voltage may be measured from the positive extremity and/or from the negative extremity. The result may be an overall voltage of the string. The site control unit 102 may report this voltage to all sensors 105A-B within the string via a broadcast message over the communication cable 104A-B and/or wireless communication.

Each sensor 105A-B may determine its relative position within the respective string of batteries 107A-B. Once each sensor 105A-B determines its relative position within the string, it may assume a logical address for purposes of communications with the site control unit 102. Thus, the system may identify an individual battery from the population of batteries under test.

Each sensor 105A-B may operate independent of the site control unit 102. Each sensor 105A-B may use the data obtained from its respective battery 107A-B to determine the battery's condition. For example, each sensor 105A-B may perform the monitoring calculations described herein with respect to the site control unit 102. Each sensor 105A-B may communicate with other batteries in the string to manage the condition of its respective battery 107A-B according to the methods described herein. Alternatively, each sensor 105A-B may communicate the data obtained from its respective battery 107A-B and/or receive instructions via the data network 101 directly.

Figure 1B:
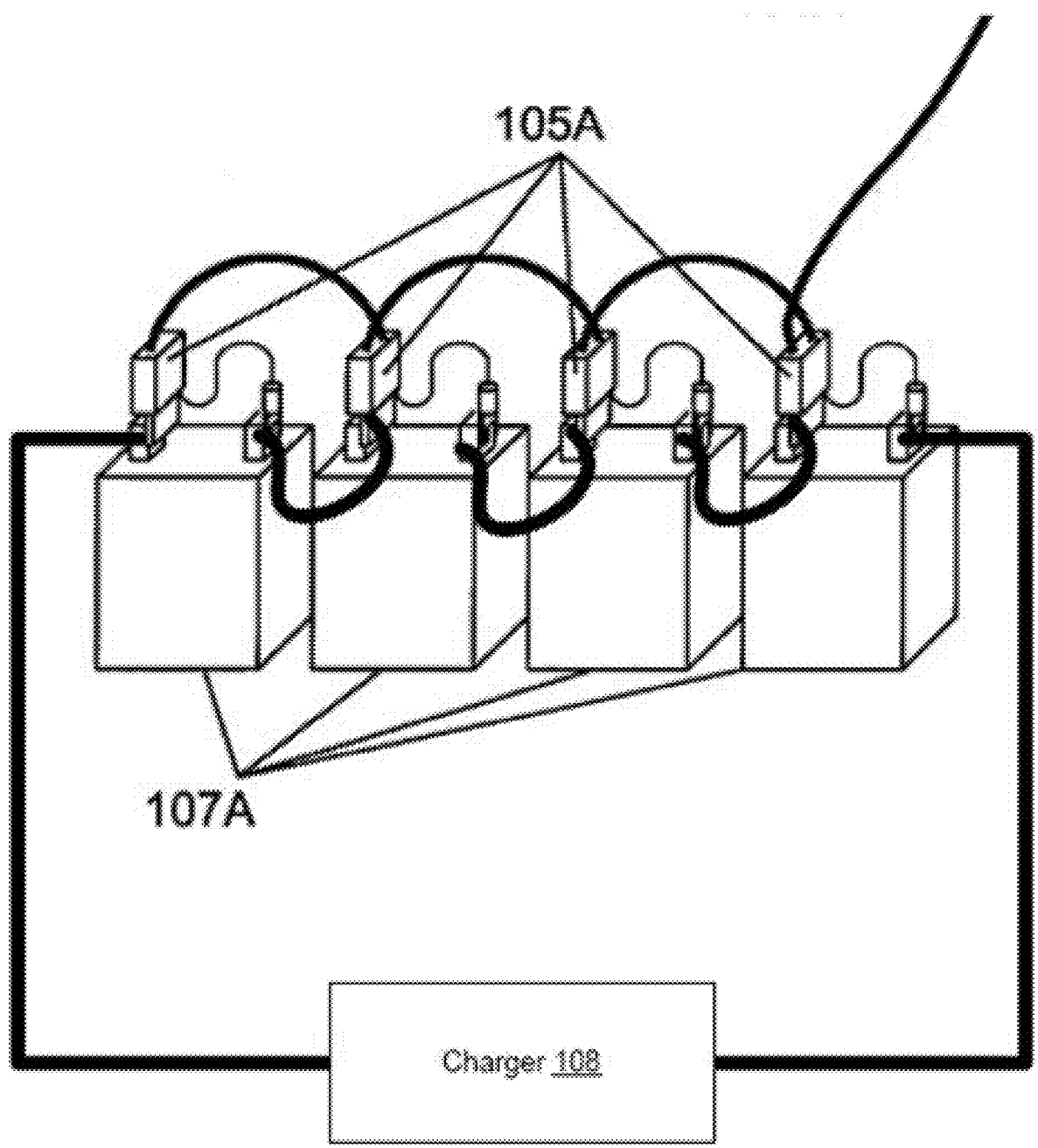
FIG. 1B depicts an example battery string with charger.

FIG. 1B depicts a battery string 107A with a charger 108. The battery string 107A may be a set of batteries wired in series. The batteries in the string may be a monobloc battery, such as a lead-acid monobloc or a lead-calcium monobloc for example, or a Ni-Cad battery, such as a flooded Ni-Cad battery for example. The battery string 107A may be connected to a battery charger 108. When battery cells are operated in a string, it may be desirable to have a single charging system which manages charging at the string level. The charger may typically have a constant current charging mode which limits the charging current in a string of deeply charged batteries until the string voltage rises to some threshold where the charger switches into a constant voltage mode. The constant voltage mode is typically used to "finish" the charging of the string of batteries and to maintain it at some prescribed "float-charge" voltage.

If all the battery cells in a string of cells were identical, then applying a constant voltage to the string for float-charging purposes would generally result in the available charger voltage being equally divided among all the battery units in the string. This condition is referred to as a "balanced" charge state. However, due to the slight manufacturing differences between cells and monoblocs, each battery unit generally has a slightly different terminal voltage when operated open-circuit or in a low-current "float-charge" mode. Thus, in a string of such battery units, each having slightly different properties, it is common to observe that some of the units in the string charge up to a higher voltage than other cells in the same string, causing their neighbors to be denied their "fair share" of the available charger voltage. This often results in some of the cells being in an overcharged state, while others are in an undercharged state.

For example, in a balanced eight-monobloc string with a string voltage of 108V, each monobloc in the string would exhibit a voltage of 13.5V. However, one example of an unbalanced eight-monobloc string could have one overcharged monobloc exhibiting a voltage of 14.2V and seven monoblocs each exhibiting a respective voltage of 13.4V. As the numbers of cells in the series charging arrangement is increased, the potential for significant imbalances between individual cells increases.

Leaving battery cells in a long-term state of undercharge or overcharge is not good for the health of battery cells, and can severely shorten their life. Cells that are maintained for long periods of time in an undercharged state tend to build up an insulating layer on their plates called "sulphation." Sulphation degrades the current-producing capability of the cell and may eventually lead to permanent damage and premature failure.

Cells that are maintained for long periods of time in an overcharged state tend to "outgas" and dry out, causing the plates to be only partially in contact with the electrolyte. Dryout is also a leading cause of premature failure in battery cells.

The charger 108 may attempt to equalize the charge voltages by applying a periodic short-duration "equalizing" high charge current. Generally, this has the effect of raising the state-of-charge for undercharged battery units, but it also may subject other units to a short duration overcharge condition. This "forced equalization" technique may not be able to keep the charge current elevated long enough to raise the charge level on undercharged cells without inadvertently overcharging, "outgassing" and drying out properly charged cells, which actually shortens battery life.

Equalizing the charge of all batteries within a string of batteries can add substantially to the life-expectancy of the batteries. Battery manufacturers state that it is desirable to maintain the charged voltage each cell within a string of cells to within +/−10 mV of all other cells. For a 12 volt monobloc battery which contains 6 cells, the terminal voltage should thus be maintained to within +/−60 mV of all other monobloc batteries (such as lead-acid or lead-calcium monoblocs) within the same string. The system disclosed herein may maintain the float-charge voltage on each battery within a string of batteries such that all batteries within the string are charged to approximately the same voltage.

Figure 2:
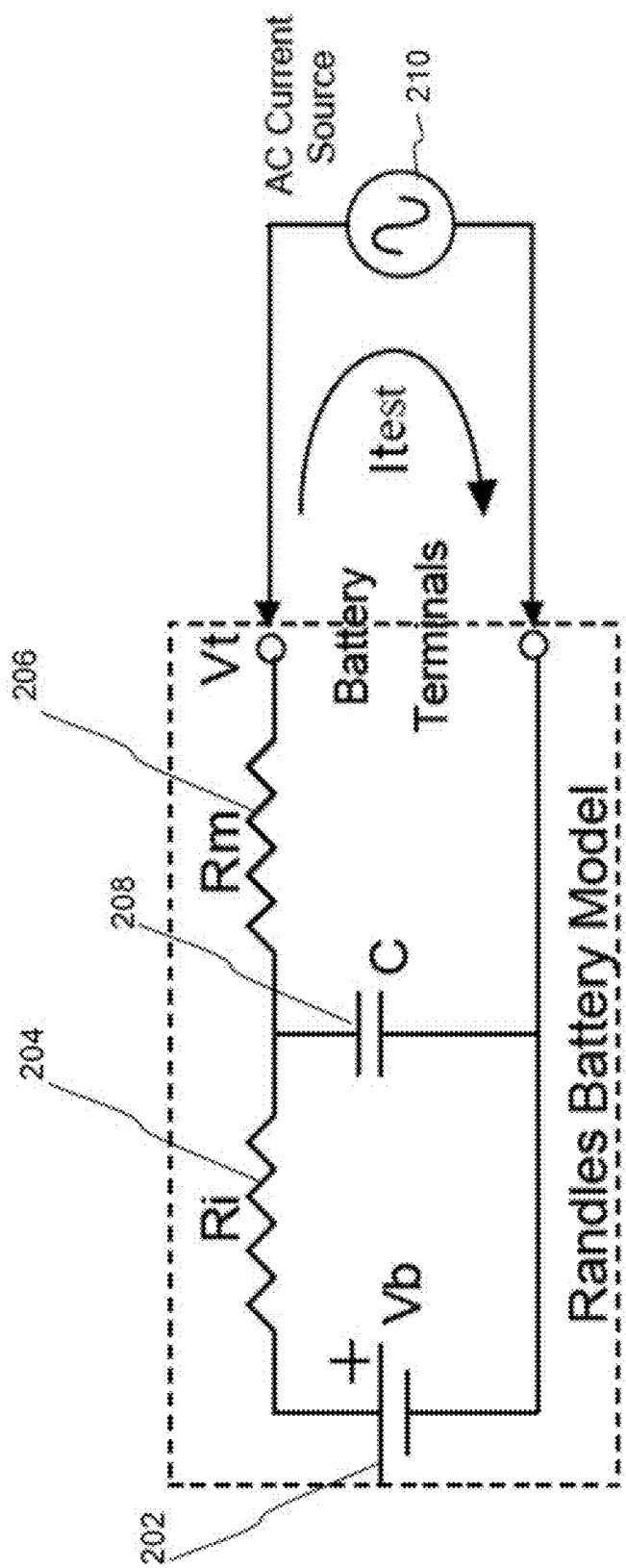
FIG. 2 depicts an example circuit diagram of battery model test circuit.

FIG. 2 depicts a circuit diagram of a battery model test circuit. A simplified model of an electrochemical battery may include an ideal voltage source (Vb 202), two significant resistance elements (Ri 204 and Rm 206), and a capacitive element (C 208) arranged as shown in FIG. 2. Other arrangements of Ri 204, Rm 206, and C 208 may be used. The model as shown is commonly called the "Randles Battery Model."

In this model, the ideal voltage source may be represented as "Vb" 202. An equivalent internal resistance attributable to the Vb source 202 may be represented as "Ri" 204. The resistance due to metallic connections may be represented as "Rm" 206. The equivalent internal capacitance may be represented as "C" 208.

For example, in practical applications of lead-acid batteries with capacities of 100-200 ampere-hours, Ri 204 and Rm 206 combined may be valued at between about 1.0 milliohm to about 10 milliohm. Rm 206 may be approximately 45% of the total internal resistance. Ri 204 may be attributed to current generating limitations of the electrochemical process. Ri 204 may be approximately 55% of total internal resistance. C 208 may be valued at about 1.5 Farads per 100 ampere-hours of capacity. Rm 206 may be attributed to the internal metallic connections.

Applying an AC current from an AC current source 210 of known frequency and amplitude and observing the resultant AC voltage developed at the battery terminals may enable a determination of values of the parameters of the circuit model. A sinusoidal AC test current (Itest) of known frequency and amplitude may be applied to the battery terminals. The AC component of the voltage developed across the battery terminals (Vt) may be a frequency dependent function. The AC component of the voltage developed across the battery terminals (Vt) may relate to the values of Ri 204, Rm 206, C 208, the amplitude of the AC test current (Itest), and the frequency of the AC test current (Itest).

For example, at low frequencies, approaching DC, the AC component of Vt may reach a maximum value determined by the combined resistance of Ri 204 and Rm 206 (Rb=Ri+Rm). At high frequencies, approaching infinity, the low reactance of capacitor C 208 may form an effective short-circuit such that Vt is primarily determined by Rm 206. Thus, the values of Ri 204, Rm 206, and C 208 may be characterized by varying the frequency of the test signal while observing the magnitude of the AC component of Vt.

To illustrate, in a typical lead-acid battery, this process may be simplified by use of the following approximations:
C=1.5F per 100 amp-hours of battery capacity
1/(Rb)=150 mho per 100 amp-hours of battery capacity
Ri=1.25*Rm These approximations generally scale linearly with amp-hour capacity. These constants may be stored in memory and used to calculate the internal battery characteristics. This linear scaling may provide an acceptable first-order approximation of a lead-acid battery's performance when subjected to the AC test current as described above. The Randles circuit equivalent, shown in FIG. 2, may be modeled with a software circuit analysis tool, SPICE for example. In the modeling, the frequency response of Vt may be shown to be relatively flat at frequencies below about 25 Hz and to reduce by about 50% as the test frequency is increased to 60 Hz. Thus, an example test frequency may include up to the 20 Hz range. Since Ri 204, Rm 206, and C 208 vary fairly linearly with a battery's amp-hour capacity, this generalized approach is useful for a wide range of battery sizes.

Figure 3:
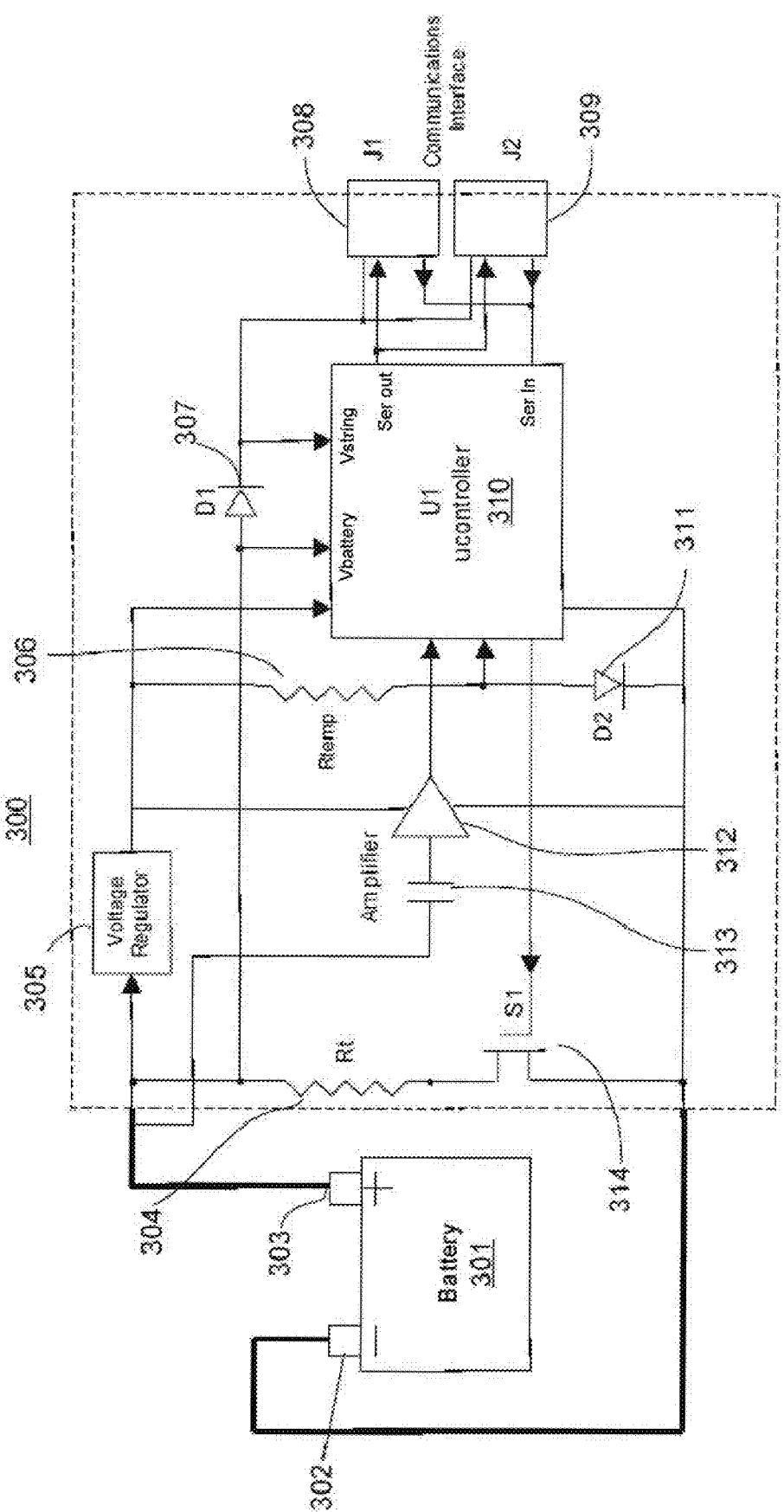
FIG. 3 depicts an example circuit diagram of an example battery sensor.

FIG. 3 depicts a circuit diagram of an example battery sensor 300. The sensor 300 is merely one embodiment; other circuits that measure similar parameters are contemplated. The sensor 300 may generate a low-frequency sinusoidal test signal by using high frequency pulse-width modulated rectangular signals to excite the battery under test. This method may achieve a low frequency sinusoidal test signal excitation using high-frequency rectangular signals.

The sensor 300 may be connected to a battery 301 under test. The positive terminal 303 of the battery 301 may be connected to a first node of a resistive load 304 with a resistance value of Rt. The second node of the resistive load 304 may be connected to one contact of a switch 314. The second contact of the switch 314 may be connected to the negative terminal 302 of the battery 301. The switch 314 may be a single pole single throw switch and may open and close current flow from the battery 301 across the resistive load 304. The switch 314 may be controllable, such as a FET switch implementation, for example.

One node of a capacitor 313 may be connected to the positive terminal of the battery 301. The other node of the capacitor 313 may be connected to the input of a voltage amplifier 312. The voltage amplifier 312, may amplify changes in voltage Vt measured at the positive terminal 303 of the battery 301 with respect to the negative terminal 302 of the battery 301.

The output of the voltage amplifier 312 may be input to a microcontroller 310. The microcontroller 310 may be a single-chip microcontroller, for example. The microcontroller 310 may include a built-in analog-to-digital converter. The microcontroller 310 may include a dual-port optically isolated serial communications interface with a first port 308 and a second port 309.

In an embodiment, the sensor 300 may include a diode 307. The anode side of diode 307 may be connected both to the microcontroller 310 and the positive terminal 304 of the battery 301. The cathode side of the diode 307 may be connected both to the microcontroller 310 and the first 308 and second 309 communications interface ports. The diode 307 in this arrangement may provide a summing function, such that when the sensor 300 is placed in a string with other like sensors, the sensor 300 may determine its position within the string.

In an embodiment, the sensor 300 may include a resistor 306 in connection with a diode 311 to measure temperature. A first node of the resistor 306 may be connected to a voltage regulator 305. A second node of the resistor 306 may be connected to both the microcontroller 310 and the anode side of the diode 311. The cathode side of the diode 311 may be connected to the negative terminal of battery 301. In this arrangement, the DC voltage across the diode 311 at the microcontroller may be proportional to the battery's temperature. Other temperature sensors, such as an electrical resistance thermometer, an infrared thermometer, a silicon bandgap temperature sensor, a thermistor, a thermocouple, a coulomb blockade thermometer, etc. may be used as well.

The voltage regulator 305 may provide DC power to the remote measurement sensor 300. One node of the voltage regulator 305 may be connected to the positive terminal 303 of the battery 301. The other node of the voltage regulator 305 may be connected to the temperature sensor 306, the voltage amplifier 312 and the microcontroller 310. The voltage amplifier 312 and the microcontroller 310 may also be connected to the negative terminal 302 of the battery 301.

The output voltage of the amplifier 312, the voltage of the temperature sensor 306, and the voltages at both sides of the summing diode 307 may be input to the analog-digital converter in the microcontroller 310. Each voltage may be measured, quantified, and used in the mathematical and logical processes of characterizing the battery 301.

The microcontroller 310 may be programmed to activate the switch 314. For example, the microcontroller 310 may cause a current (Itest) to flow in the battery when the switch FET gate is driven high. The current Itest may be determined by the battery voltage (Vb) and the value of Rt according to the formula Itest=Vb/Rt. Moreover, this test current may be a programmable discharge current in the system that may be used to equalize the battery attached to the sensor.

Figure 4A:
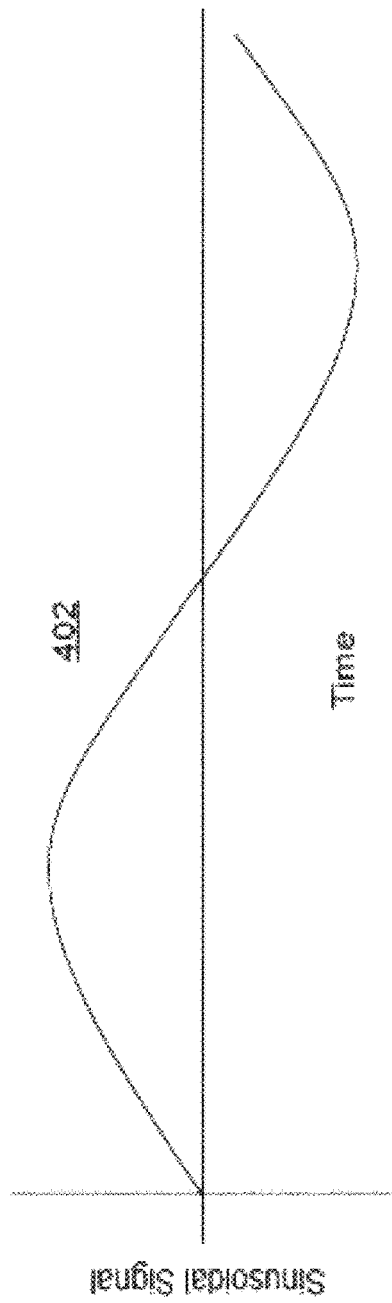
FIGS. 4A & 4B depict an example sinusoidal signal and a corresponding pulse width modulated signal, respectively.
Figure 4B:
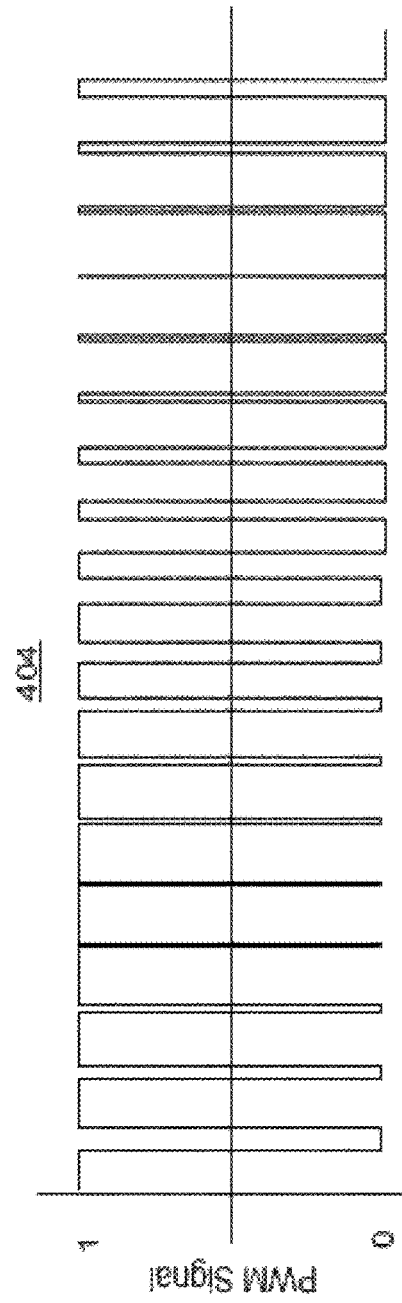

FIGS. 4A & 4B depict an example sinusoidal signal 402 and a corresponding pulse width modulated signal 404, respectively. The microcontroller may have a stepwise approximation of a sinusoid signal 402 stored as a lookup table in its nonvolatile memory. For example, the stepwise approximation may include 256 points. More or fewer points in the lookup table can be used with varying resolution.

The microcontroller may generate a pulse width modulated signal 404 that corresponds to the sinusoidal signal. The microcontroller may include software or hardware to implement a pulse width modulator (PWM). The PWM may step through the values in the sinusoid lookup table. The microcontroller may activate the FET switch for a time proportional to each table value.

The switch may be activated (or closed) for a time (Ton) and then deactivated (or opened) for a time (Toff) such that the duty cycle of the test signal varies in accordance with the stepwise approximation. The duration of Ton and/or Toff may be determined by the sinusoid values from the look up table. Each on-off cycle (i.e., Ton+Toff) may have a constant time period (Tperiod). The value Tperiod may be determined according to the desired low frequency test sinusoid frequency (Ft) and the number of points (Np) in the sinusoid lookup table. For example, Tperiod may be equal to the result of 1/(Ft*Np).

Figure 5:
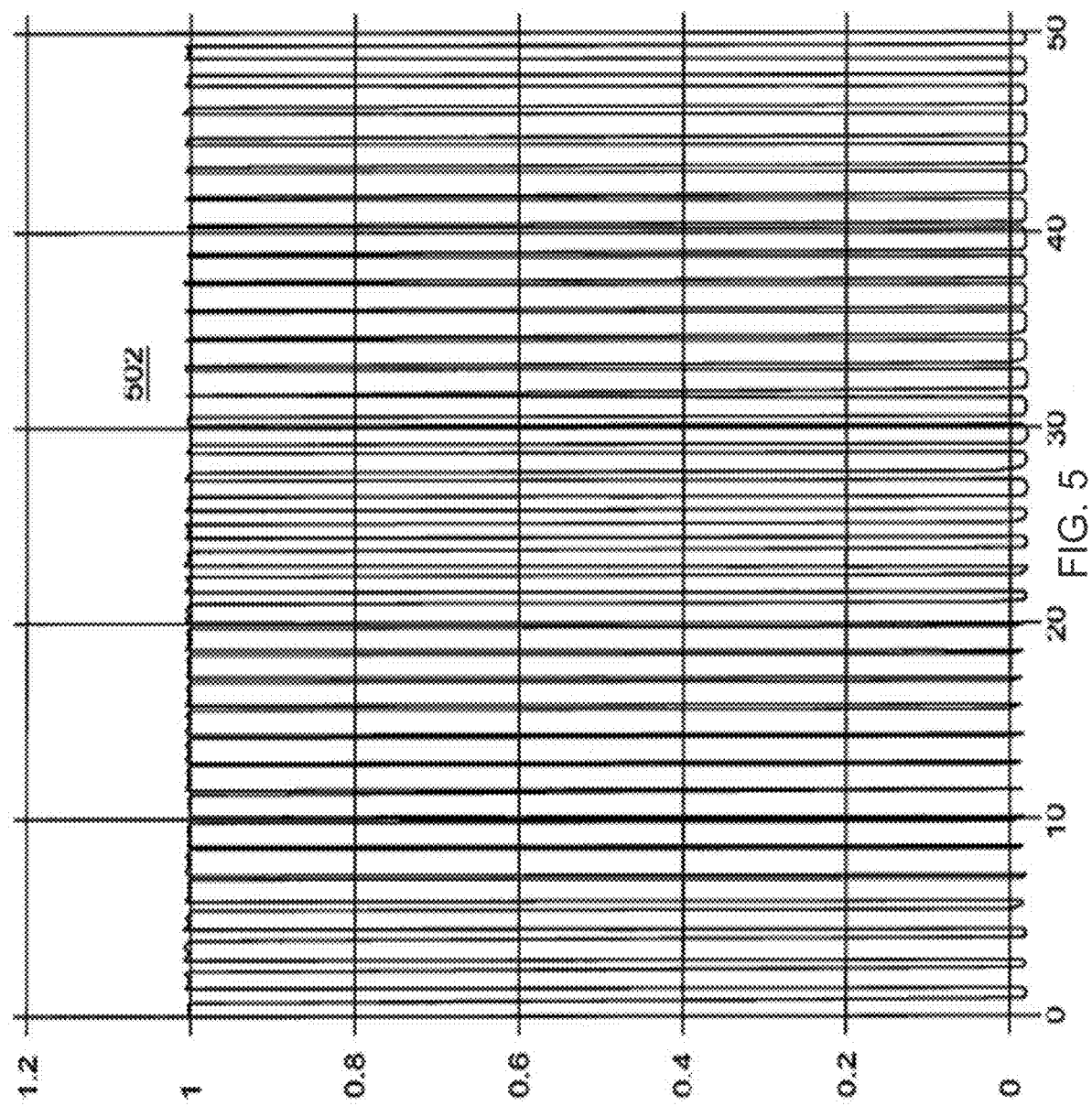
FIG. 5 depicts a signal trace of an example pulse width modulated test signal.

FIG. 5 depicts a signal trace of an example pulse width modulated test signal 502. The microcontroller may generate the pulse width modulated test signal 502. The pulse width modulated test signal 502 may have a rectangular "carrier" frequency. The pulse width modulated test signal 502 may be pulse-width modulated with a lower frequency sinusoidal signal. This example pulse width modulated test signal 502 may drive the switching element S1 314, as shown in the circuit in FIG. 3, thus applying the test signal 502 to the battery under test.

To illustrate, where Ft=20 Hz and Np=256, Tperiod=1/(Ft*Np)=195 usec, or 5128 Hz. A 5128 Hz sinusoidally pulse width modulated rectangular signal, if integrated, may yield a 20 Hz sinusoid. In this illustration, the battery under test may be excited by a rectangular signal with a peak value equal to Itest. Because the instantaneous duty-cycle of this rectangular pulse-train may be modulated by a 20 Hz sinusoid, the average current of the test signal, if integrated, may vary at a 20 Hz rate. The RC time constant of the battery itself may perform the first part of this signal integration, and the circuitry and software within the sensor may provide additional integration.

In an embodiment, the microcontroller can vary the frequency of the test signal 502 by implementing a phase-increment algorithm. In this process, a frequency variable is added to the lookup table location pointer such that every second, third, or nth table location is accessed. The frequency variable defines the number of lookup table positions between each sample being output to the PWM. As the frequency variable is increased, the frequency of the generated signal 502 may increase.

In an embodiment, the current of the integrated sinusoidal frequency test signal may be adjusted by consistently scaling the values in the lookup table before they are passed to the PWM. For example, if each table value is halved before being output to the PWM, then the average current in the integrated sinusoidal frequency test signal will also be halved, even though the higher frequency peak rectangular current is fixed. Finally, the values in the microcontroller's PWM lookup table can be altered, if desired, in order to generate any desired waveform including sinusoid, triangle, sawtooth, rectangular, or virtually any other test signal which may be advantageous.

Thus, the microcontrollers in the individual sensors turn on their PWM's at the appropriate pulse-width in order to generate discharge currents to equalize the associated battery. While the discharge current is being generated, and for the duration of the time parameter specified by the site control unit, the microcontroller's analog-to-digital converter measures the sensor's associated battery terminal voltage and compares it to the target voltage transmitted to it by the site control unit. If the target voltage is reached before the timeout is reached, or if the site control unit sends new discharge specifications, the sensor's microcontroller will turn off the output of the PWM. As the overcharged batteries are discharged to their specified target voltages as described, the fixed-voltage charger will force the string voltage to remain constant, and consequently the batteries that weren't being discharged will accept a larger percentage of the available charger current, causing their voltages to rise compared to the batteries being discharged by the sensors.

It is also possible to generate a steady-state current, similar in effect to a DC current, by sending non-varying duty-cycle values to the PWM. This also generates a programmable discharge current in this system.

Figure 6:
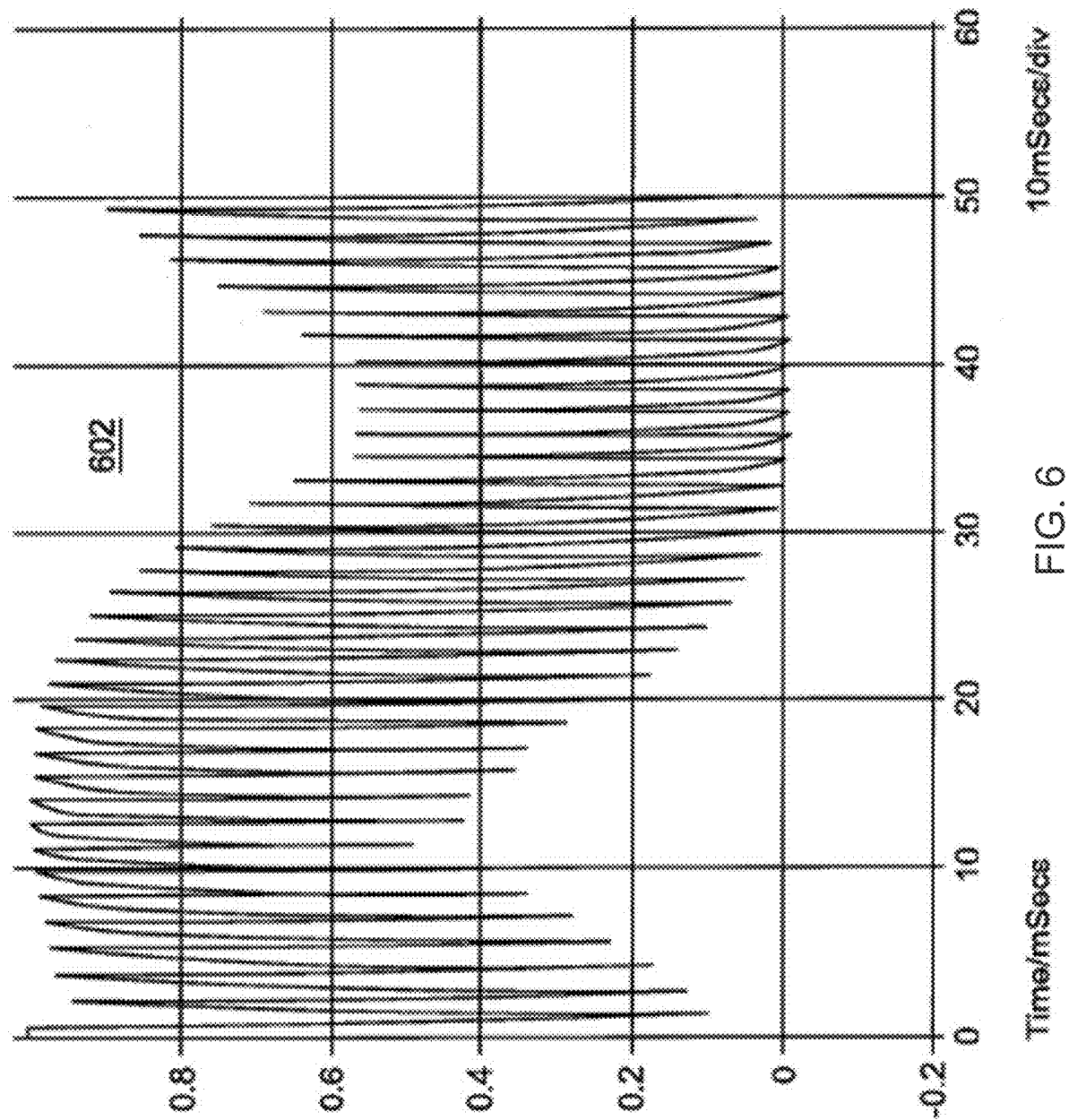
FIG. 6 depicts an example excitation signal, as measured from a battery under test.

FIG. 6 depicts an example excitation signal 602, as measured from a battery under test. The sensor may measure the excitation signal 602, which results from the pulse width modulated test signal having been impressed on the battery. The excitation signal 602 illustrates the AC voltage that develops across the battery terminals as a result of the pulse-width modulated rectangular excitation current shown in FIG. 5. At this point, the excitation signal 602 has been partially filtered due to the RC characteristics of the battery. The battery, owing to its behavior as an RC equivalent circuit, provides a preliminary low-pass filtering function which attenuates some of the high frequency switching carrier and begins to reveal the desired low frequency sinusoidal frequency component.

Figure 7:
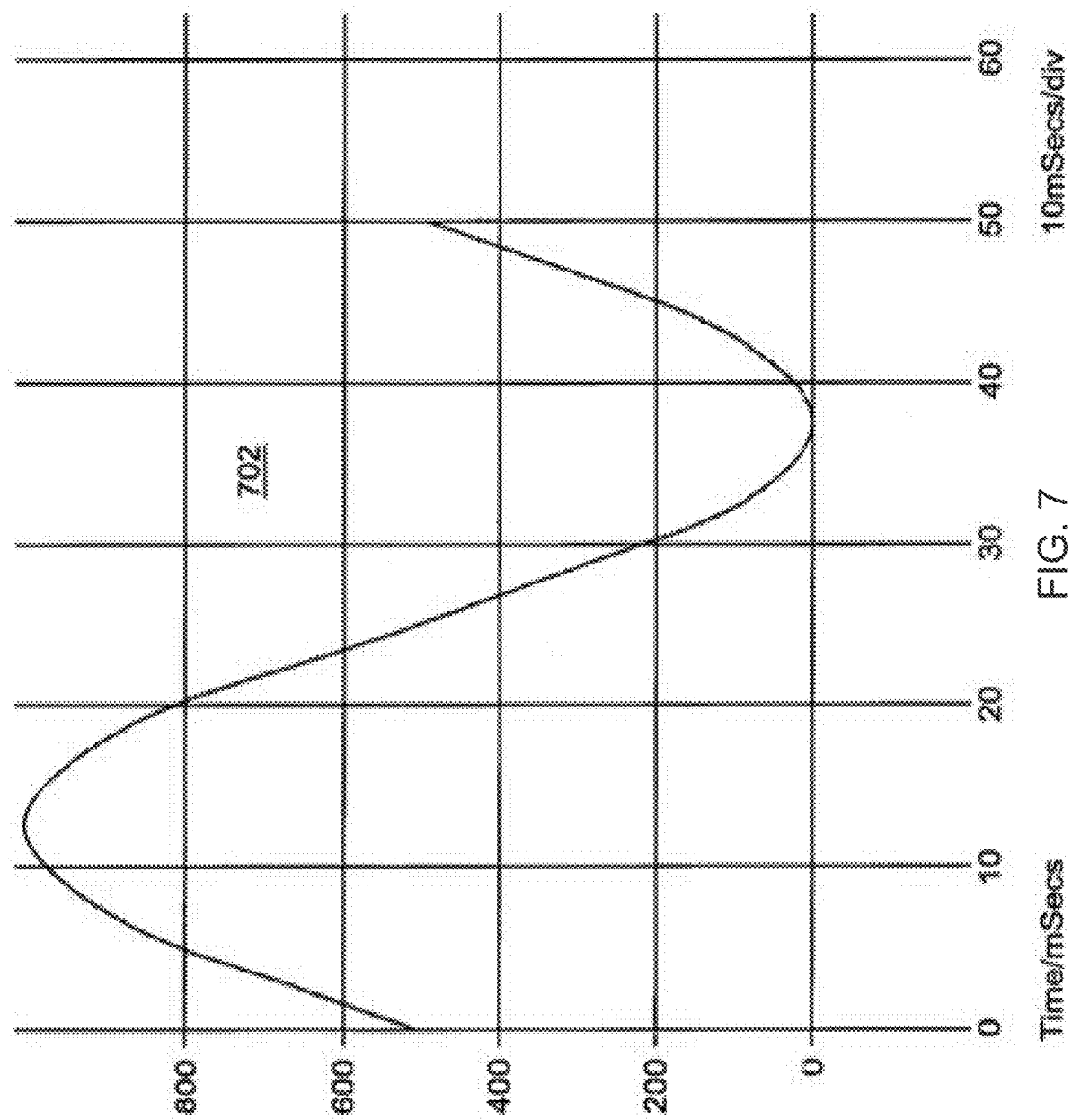
FIG. 7 depicts an example filtered excitation signal.

FIG. 7 depicts an example filtered excitation signal 702. The filtered excitation signal 702 illustrates the result of fully filtering the voltage that developed across battery. The filtered excitation signal 702 may be measured by the microcontroller.

Further filtering inside the sensor may eliminate or significantly reduce the residual high frequency switching component, leaving the low frequency sinusoidal modulation component as the primary signal to be measured. For example, the sensor may include a high-gain amplifier that is AC coupled (e.g., capacitive coupled) to the battery under test. The output of the high gain amplifier may be fed into the analog-to-digital converter in the microcontroller for measurement.

The gain of the amplifier may be controlled by the microcontroller so that a wide range of battery types with differing internal resistances can be measured. For example, the amplifier gain may be in the range of about 200 to about 1000. Also for example, the total internal resistance $Ri=(Ri+Rm)$ of the battery under test may be equal to 0.005 ohm. The integrated component of the low frequency test signal may be equal to 1 ampere peak-to-peak. Then, the AC component of Vt may be $Vt=Itest*Rb=1.0 A*0.005 ohm=5$ mV peak to peak. This signal may be amplified by a factor of 200, and the result may be a 1.0 volt peak-to-peak signal that is fed to the analog-to-digital converter in the microcontroller for measurement.

Figure 8:
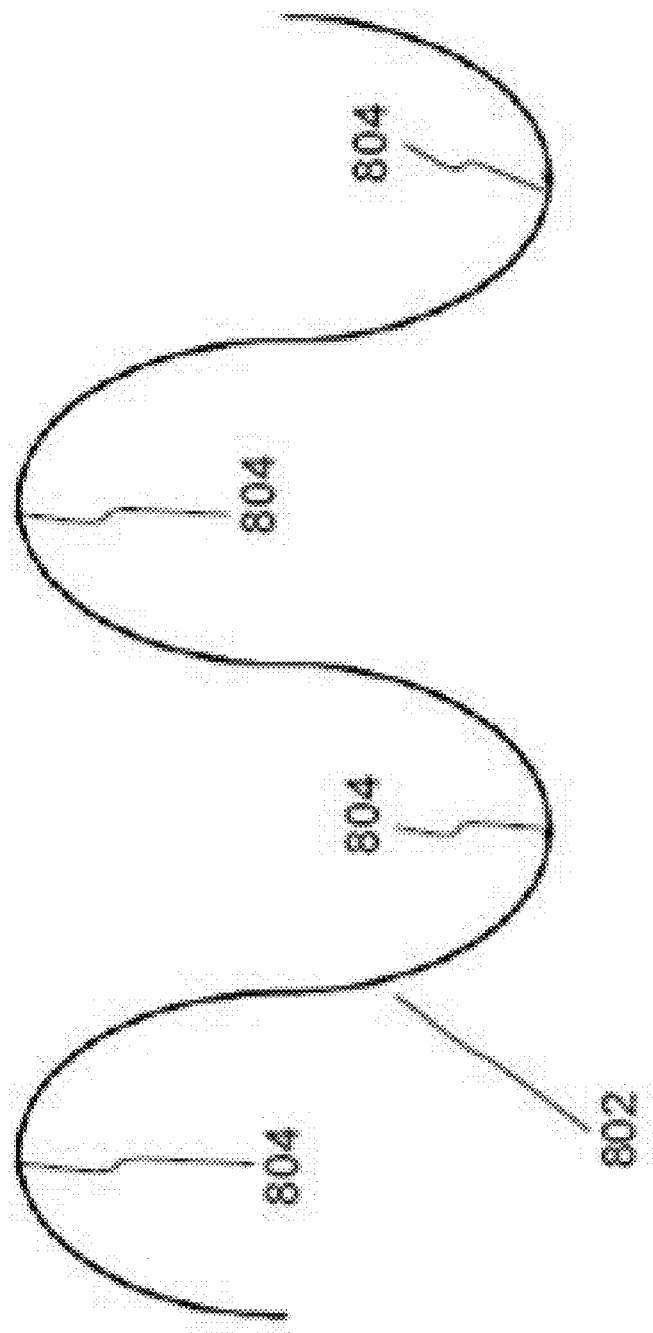
FIG. 8 depicts an example timing diagram for sampling.

FIG. 8 depicts an example timing diagram for sampling. Because the microcontroller may generate the pulse width modulated signal point-by-point, the resultant filtered excitation signal also may be measured point-by-point. The sensor may sample the waveform 802 at defined sample points 804. The sample points 804 may correspond to the signal peaks and valleys. (i.e., the alternating maximums and minimums of the filtered response signal from the battery under test.)

The microcontroller can determine when to sample the recovered signal at the signal peaks and valleys. Each signal peak may be a local maximum. Each signal valley may be a local minimum. Via a correlating synchronous sampling detection process the microcontroller can measure the resultant waveform. Such a process may have a bandpass amplitude response that can discriminate against unwanted signals at frequencies that differ from the sampling rate. The bandwidth of this bandpass response decreases as the number of averaged samples is increased.

For example, as the microcontroller generates each point in the digitally synthesized excitation current sinusoid, it measures at the peaks of the resultant voltage sinusoid. The microcontroller may make multiple measurements at the sinusoidal signal peaks repetitively and may perform an arithmetic average of the measurements.

Since the microcontroller is generating the pulse width modulated test signal while simultaneously measuring the batteries response, the microcontroller may determine when the peaks of the amplified signal will occur and measure the precise peak-to-peak value of the amplified Vt signal. The microcontroller may measure the response signal in accordance with a signal value that produces a peak. The microcontroller may be programmed to measure a plurality (e.g., 256) positive and negative signal peaks. The microcontroller may perform a mathematical average of the measured values.

Although FIGS. 4A-8 show waveforms with differing scale factors, it should be appreciated that scale factors may be set appropriate for the type of battery being measured. For example, the rectangular excitation waveform, as shown in FIG. 5, may switch between zero amps and a peak excitation current appropriate for the type of battery being measured. In typical applications, this peak current may range from about 1-2 amps, and the frequency of the modulating sinusoid may range from 10-30 Hz. The peakto-peak value of the unfiltered (e.g., as shown in FIG. 6) and fully filtered waveform (e.g., as shown in FIG. 7) may be a function of the peak excitation current and the internal impedance (Z) of the battery. The value of this voltage will typically follow Ohm's Law: Vbat=Ipeak×Zbat. The admittance of the battery may be calculated as the inverse of the impedance (i.e., Zbat).

Figure 9:
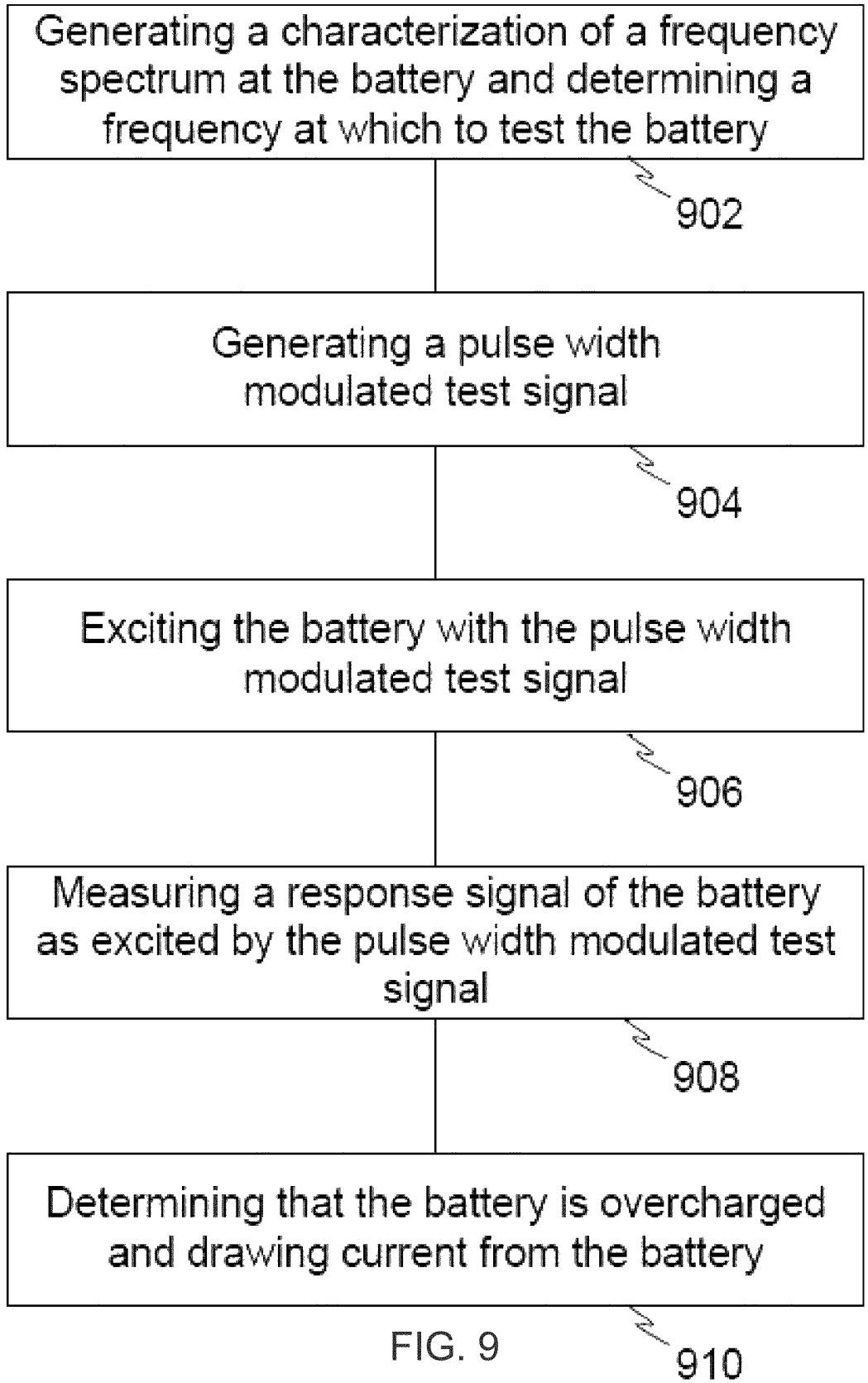
FIG. 9 depicts an example flow chart for testing an internal characteristic of a battery.

FIG. 9 depicts an example flow chart for testing an internal characteristic of a battery. At 902, the sensor may generate a characterization of a frequency spectrum at the battery. The sensor may determine a frequency at which to test the battery. Generally, in battery power-plant systems, the battery charging sub-system, the load subsystem, and various other influences often produce noise and other disturbances that generate interference. The sensor may characterize the signal spectrum around the frequency where a battery test is proposed to be made in order to determine if background noise and interference levels are sufficiently low to make an accurate measurement. The sensor may make frequency agile, frequency selective measurements of AC signals.

The disclosed correlating detection process may be used by the sensor in order to scan a range of frequencies around a proposed measurement frequency. For example, the sensor may operate in a receive-only mode, altering the detection sampling frequency in a stepwise manner, making a signal measurement at each sampling frequency. If the frequency selective detection process is run without generating a corresponding test signal, the detection process may measure the level of signals at the sampling frequency. If this receive-only measurement process is repeated for multiple frequencies within some spectral range, then a spectrum-analysis data set is available. This spectrum analysis data set can be analyzed to determine a frequency or for measurements that reduces the effect of interfering signals.

After a range of frequencies are scanned and characterized in this manner, the sensor may choose a frequency at which the measured background noise is at a minimum and/or sufficiently low to make the measurement. The sensor may then proceed to operate the FET current switch to generate the test signal and make the battery test measurements. In an embodiment, the sensor may report the receive-only frequency point measurements to the control unit so that the result can be displayed as a spectrum analysis display. The sensor may report the battery test results and battery test data to the control unit.

At 904, sensor may generate a pulse width modulated test signal. The duty cycle of the pulse width modulated test signal may vary in accordance with a plurality of alternating current signal data values. For example, the plurality of alternating current signal data values may be stored in memory as a stepwise approximation of a sinusoidal waveform. The frequency of the sinusoidal waveform may be selected based on the results at 902.

At 906, the battery may be excited with the pulse width modulated test signal. For example, the sensor may apply the test signal to the terminals of a battery under test. The sensor may apply the signal to the battery under test concurrently with generating the test signal. For example, the sensors may drive a controllable switch with the test signal. The switch when closed may drive a test current across the battery under test.

The battery may alter the test signal, producing a response signal. The response signal may be a version of the test signal altered due to the RC characteristics of the battery. The battery, owing to its behavior as an RC equivalent circuit, may provide a preliminary low-pass filtering function that attenuates some of the high frequencies of the pulse width modulated test signal. The resultant response signal may reveal a desired low frequency sinusoidal frequency component. The response signal may be further filtered by the sensor.

At 908, the response signal of the battery as excited by the pulse width modulated test signal may be measured. The response signal may be sampled in accordance with the generating of the test signal. For example, the response signal may be sampled via correlating synchronous sampling detection process. The response signal may be measured by sampling at each peak and valley of the response signal by the microcontroller based on the data that the microcontroller used to generate the test signal.

Correlated detection measurement may, in effect, produce a frequency selective, bandpass filtered, detection function on the amplified signal. This detection function may result in the detection of the desired signal's amplitude while rejecting the high-frequencies generated by the sensor's PWM and other noise sources in the battery plant system. As more measurements are averaged the detection process may become more selective and the measurement time may increase.

From the measurements, the microcontroller may determine the RC characteristics of the battery. For example, the microcontroller may determine the admittance of the battery. The microcontroller may measure the resultant amplitude to determine the RC characteristics of the battery including the admittance. The admittance may be used as an indication of the health of the battery.

At 910, it may be determined that the battery is overcharged. If it is determined that the battery is overcharged, current may be drawn from the battery to correct the overcharged state. For example, the microcontroller may be used to draw current from the battery. In an embodiment, current may be drawn from a battery selected from a string of batteries.

Figure 10A:
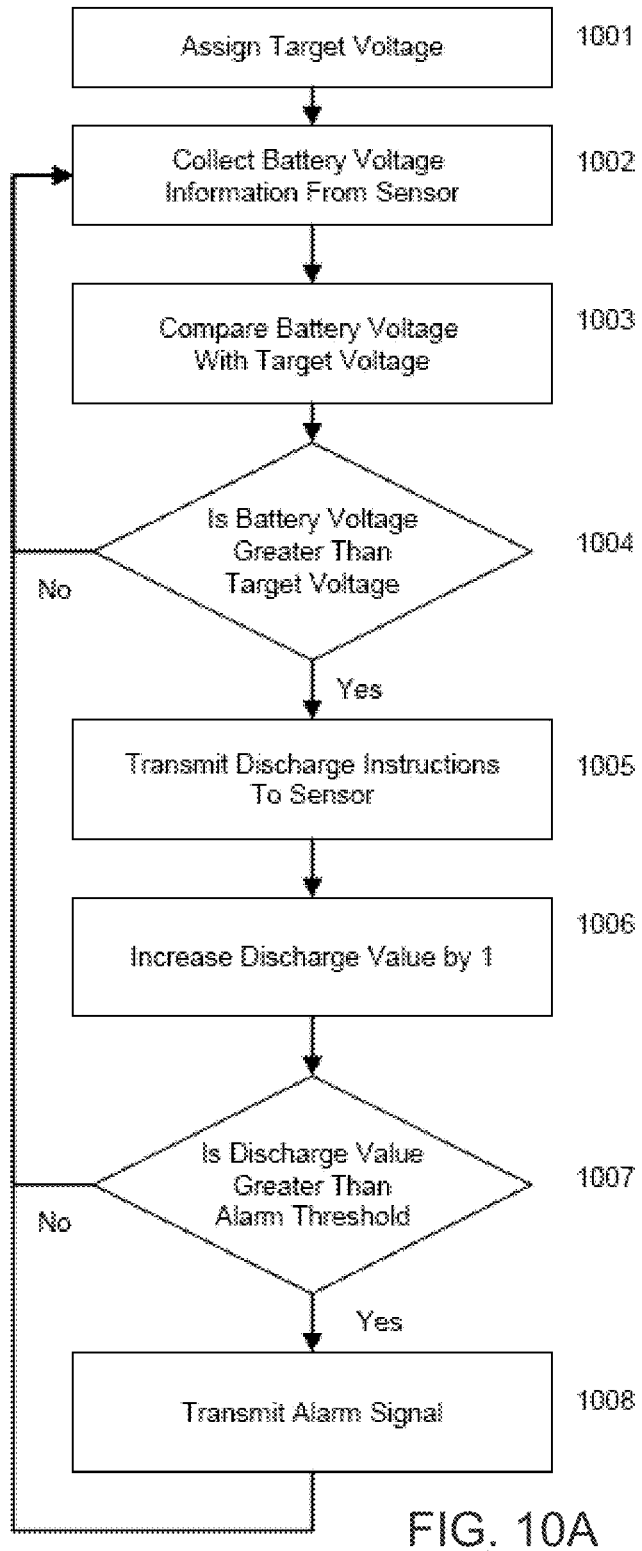
FIGS. 10A & 10B depict example flow charts for utilizing battery equalization metrics to monitor battery health.
Figure 10B:
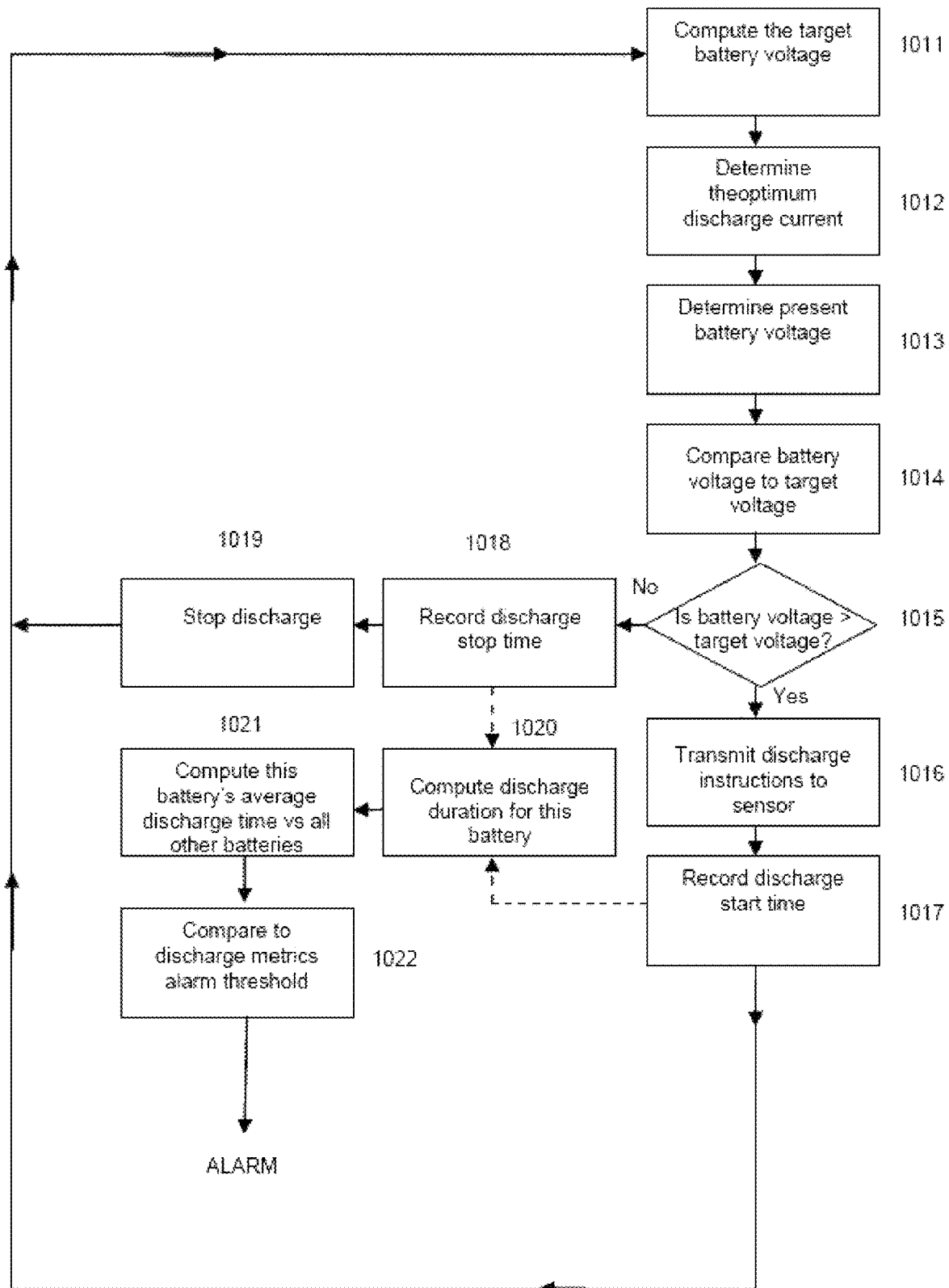

In one embodiment, the current may be produced by the sensor which has a programmable current source controlled by a microcontroller (U1) which is in 2-way communications with a site control unit via a communications interface (J1,J2). The microcontroller which may be a Microchip PIC 16F684 or equivalent, has an internal analog-to-digital converter which can measure the battery terminal voltage, and a pulse-width modulator (PWM) which can be connected to the gate of an external power MOSFET (S1) in order to generate a high peak-current through the battery determined by the value of a resistor (Rt) in the sensor. As an example, if the battery's nominal terminal voltage is 12 VDC and the resistor (Rt) value is 12 ohms, then a peak current of 1.0 amps will be drawn from the battery whenever the microcontroller's PWM drives the MOSFET (S1) gate high. For example, if the PWM pulse-repetition interval is fixed at 250 usec and the PWM pulse width is set at 2.5 usec then the average current discharged from the battery would be 0.01 amps. By varying the PWM's pulse width, the microcontroller may vary the discharge current according to commands sent from the site control unit. It is also possible to generate a steady-state current, similar in effect to a DC current, merely by sending non-varying duty-cycle values to the PWM. This is the preferred method for generating the programmable discharge current in this system FIGS. 10A & 10B depict example flow charts for equalizing and monitoring battery charge. The central site control unit may receive information about battery voltage from the individual battery sensors. The central site control unit may monitor the terminal voltages of each battery in each string, and by sum of the voltages of each battery in the each string, the central site control unit may monitor the overall voltage of the string.

The central site control unit may be provisioned with a target overall voltage charge target and may direct the battery sensors to discharge current to maintain that target. For example, the act of discharging current in a particular battery may equalize the voltage of that battery downward. The act of discharging current may develop 1-3 watts of heat in a typical monobloc string installation. The battery type and sensor may be suitable for dissipating the heat generated from the discharge. For example, each battery (such as a monobloc, for example) may have a size, surface area, and packaging suitable for dissipating the heat without adversely affecting operation of the battery.

The site control unit can determine which batteries might be overcharged and which batteries might be undercharged. The site control unit may send commands to the sensors on the overcharged batteries instructing them to discharge current. For example, the sensor may generate a test current, as described above, on the battery until the excess charge is removed.

The string of batteries being considered by the site control unit may be connected to a charger, such as the charger 108 depicted in FIG. 1B for example. Because the batteries are being charged, the act of not discharging a particular battery may equalize the voltage of that battery upward. The central site control unit and/or the individual sensor may be in communication with the battery string charger. The central site control unit may direct the charger to charge at a particular voltage level. The central site control unit may direct the charger to turn on and/or off as appropriate for maintaining the target voltage.

In FIG. 10A, the charge equalization process may be performed by each battery sensor. The charge equalization process may be performed under the supervision and control of the site control unit. At 1001, the site control unit may determine a 'target' charge voltage for all batteries in the string. This target voltage may be the total string voltage measured by the site control unit divided by the number of batteries in the string. The target voltage may be a computation of the 'mean' battery voltage based on the measurements of individual battery voltages by the sensors and reported to the site control unit.

At 1002, the site control unit may then collect battery voltage information from the sensor. The site control unit may store the collected battery voltage information in memory.

At 1003, for each battery string, the site control unit may compare each collected battery voltage with the target charge voltage to determine if a given battery is overcharged.

At 1004, the site control unit may determine that the battery is not overcharged and may return to monitoring the battery voltage as in 1002. If the site control unit determines at 1004 that the battery voltage is greater than the target voltage the site control unit may then determine an optimum discharging current for each sensor to discharge from its associated battery. The discharging current may be based on the difference between the relevant battery's terminal voltage and the target voltage.

Next, at 1005, discharge instructions may be communicated to the sensor. These instructions may include a maximum allowable discharging time for each sensor. The sensor may use this information to automatically turn off the discharging current if the target voltage isn't reached within a prescribed time.

The site control unit may transmit the individual target voltages, discharge currents, and discharge times to the sensors on the individual batteries via the communications interface. The microcontrollers in the individual sensors may turn on their PWM's at the appropriate pulse-width in order to generate the specified discharge currents. For example, the discharge instructions may indicate to the sensor to use a pulse-width modulated discharge pattern, such as the one illustrated in FIG. 12A. While the discharge current is being generated, and for the duration of the time parameter specified by the site control unit, the microcontroller's analog-to-digital converter may measure the sensor's associated battery terminal voltage and compare it to the target voltage transmitted to it by the site control unit. If the target voltage is reached before the timeout is reached, or if the site control unit sends new discharge specifications, the sensor's microcontroller may turn off the output of the PWM.

As the overcharged batteries are discharged to their specified target voltages as described, the fixed-voltage charger (See FIG. 1B) may force the string voltage to remain constant, and consequently the batteries that weren't being discharged may accept a larger percentage of the available charger current, causing their voltages to rise compared to the batteries being discharged by the sensors.

The site control unit may periodically compute new target voltage measurements and transmit this information to the individual sensors. The charge equalization process may be repeated for as long as any battery-to-battery imbalances exceed some threshold, or until the process is otherwise disabled.

Over a period of time, the terminal voltage of some batteries within the string of batteries will continue to increase above the target string voltage, even after a battery discharge has been completed. Due to this voltage drift, certain batteries within the string may have their terminal voltages equalized more often than other batteries within the string.

At 1006, metrics about how often each battery needs to be equalized may be collected by each sensor and transmitted to the site control unit. Thus the site control unit may maintain a comparative listing of how often each battery within the string needed to be equalized. These equalization metrics may offer additional information about the battery state-of-health. Alarm thresholds may be placed around the individual battery equalization metrics to notify maintenance personnel if a battery's performance changes substantially.

At 1007, the site control unit may compare the discharge value to the alarm threshold. If the discharge value does not exceed the alarm threshold the sensor may continue to collect battery voltage information from the sensor. If the discharge value is greater than the alarm threshold, at 1008 the site control unit may transmit an alarm signal. This alarm signal may be communicated to a remote operations center or to an alarm located locally to the sensor or the battery string.

In FIG. 10B, the target battery voltage may be computed at 1011. When all the batteries in a string are properly charged, each battery's terminal voltage should be equal to the string voltage divided by the number of batteries in the string. Typically, this is the target battery voltage. The control unit may poll each battery sensor to determine the voltage of each individual battery. The individual battery voltages may be summed to determine a measured string voltage. This sum may be divided by the number of battery sensors detected. Other methods may also be used to determine the target voltage, including calculating the mean or the average of all the individual battery voltages.

At 1012, the optimum discharge current may be determined. Generally, the optimum discharge current for an individual battery may be a function of the difference between the present battery voltage and the target battery voltage. The optimum discharge current may be obtained from a lookup table indexed by this difference. The optimum discharge current may be obtained algorithmically according to a continuous mathematical expression based on the difference between the present voltage and the target voltage.

At 1013, the present battery voltage may be determined. The present battery voltage is typically derived from the voltage reported by the individual battery sensor the last time the sensor was polled by the control unit. And, at 1014, the present battery voltage is compared to the target voltage. For example, the target individual battery voltage may be subtracted from the present battery voltage to obtain a difference voltage.

At 1015, it is determined whether the battery voltage or the target voltage is greater and/or if the difference exceeds an equalization specification. If the battery voltage is greater than the target voltage, the battery sensor should begin to discharge it. If the battery voltage is not greater than the target voltage, the battery sensor should stop any ongoing discharging of the battery.

At 1016, the instructions to discharge or to stop any ongoing discharge may be transmitted to the sensor. If the instruction is to discharge the battery, the control unit sends a command to the individual battery sensor instructing it to begin discharging the battery at the calculated discharge current. The discharge instructions may indicate to the sensor to use a pulse-width modulated discharge pattern, such as the one illustrated in FIG. 12A, for example.

At 1017, the discharge start time is calculated. The discharge start time may be recorded for each individual battery being discharged.

The process may loop until the battery voltage is at the target, at 1015. Then, the discharge time be recorded, at 1018, and the discharge may be stopped, at 1019. The control unit may send a command to the individual battery sensor instructing it to cease discharging the battery. The discharge time may be saved.

At 1020, the discharge duration for the battery may be computed. For example, the recorded discharge start time may be subtracted from the recorded discharge start time to obtain the duration of the discharge event for the individual battery. This duration may be added to an accumulated total discharge time for the individual battery.

At 1021, the battery's average discharge time may be computed and compared against other batteries' discharge times. Metrics may be continuously calculated to determine the amount of time that is spent discharging each individual battery vs. the amount of time that is spent discharging each of the other batteries in the string. If any individual battery is determined to require significantly more or less discharge time than other batteries in the string, an alarm condition may be generated by the control unit. The process of computing and comparing battery discharge-time histories can be accomplished by a statistical mechanism, such as a t-test for example.

Figure 11:
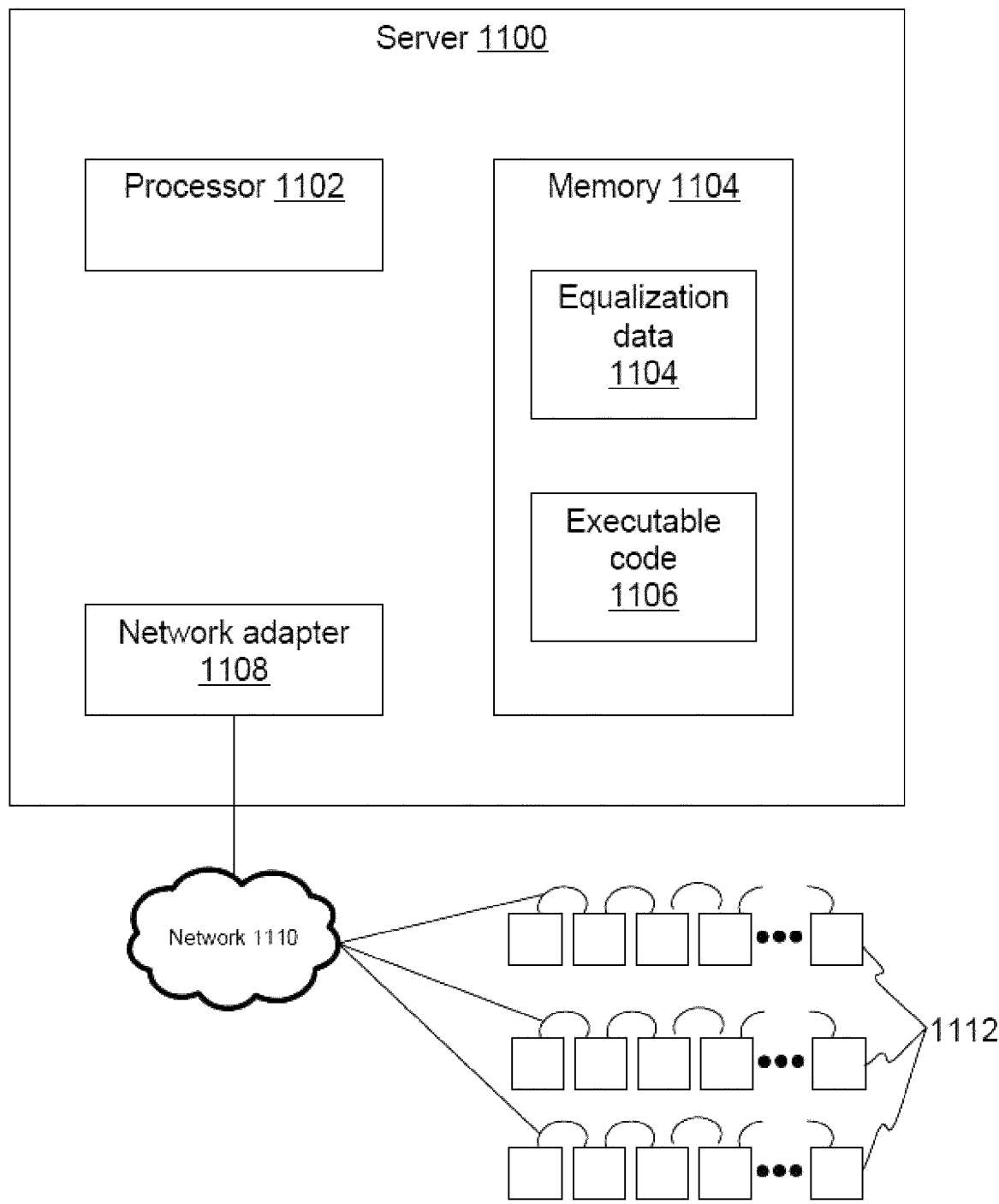
FIG. 11 depicts an example system for equalizing batteries in a battery string.

FIG. 11 depicts an example system for equalizing batteries in a battery string. For example, a computing device 1100 may include a processor 1102, a memory 1104, and a network adapter 1108. The network adapter may facilitate communication with one or more sensors attached to one or more battery strings 107A via a network 1110.

The processor may include any hardware, firmware, and/or combination thereof to process computer executable code 1106. The computer executable code 1106 may include computer instructions that when executed by the processor 1102 perform the methods described herein, such as the methods described in FIGS. 10A and/or 10B for example.

The memory may include any device, component, system, and/or subsystem suitable for storing information. For example, the memory may include computer-readable storage media, such as Random Access Memory, Read Only Memory, magnetic storage, such as a hard disk drive, flash memory, optical drive storage, or the like. The memory may have stored therein the computer executable code 1106 and equalization data 1104. The equalization data 1104 may include individual measurements from individual battery sensors, overall voltages of battery strings, target voltages, timing information, stored provisioned data, and historical data recording past battery sensor measurements and/or past instructions sent to the battery sensors, such as instructions to discharge and/or equalize individual batteries.

Accordingly, the computing device 1100 may receive information about a battery string and the individual batteries within that string. The information may include individual battery voltages and a string voltage. The computing device 1100, as operated by the computer executable code 1106, may determine a target voltage for each battery in a given string. The computing device 1100 may instruct individual battery sensors to discharge battery current in accordance with the target voltage for that string. Moreover, the computing device 1100 may store a detailed record of the equalization activity and generate reports indicating which batteries in the string receive the most often equalization activity. Accordingly, the computing device 1100 may set an alarm or a reporting structure that, based on this historical equalization activity, is indicative of the likelihood of a battery health problem with each battery in a string. Thus, batteries that are indicated as unhealthy may be serviced and/or removed from the string before they fail.

Figure 12A:
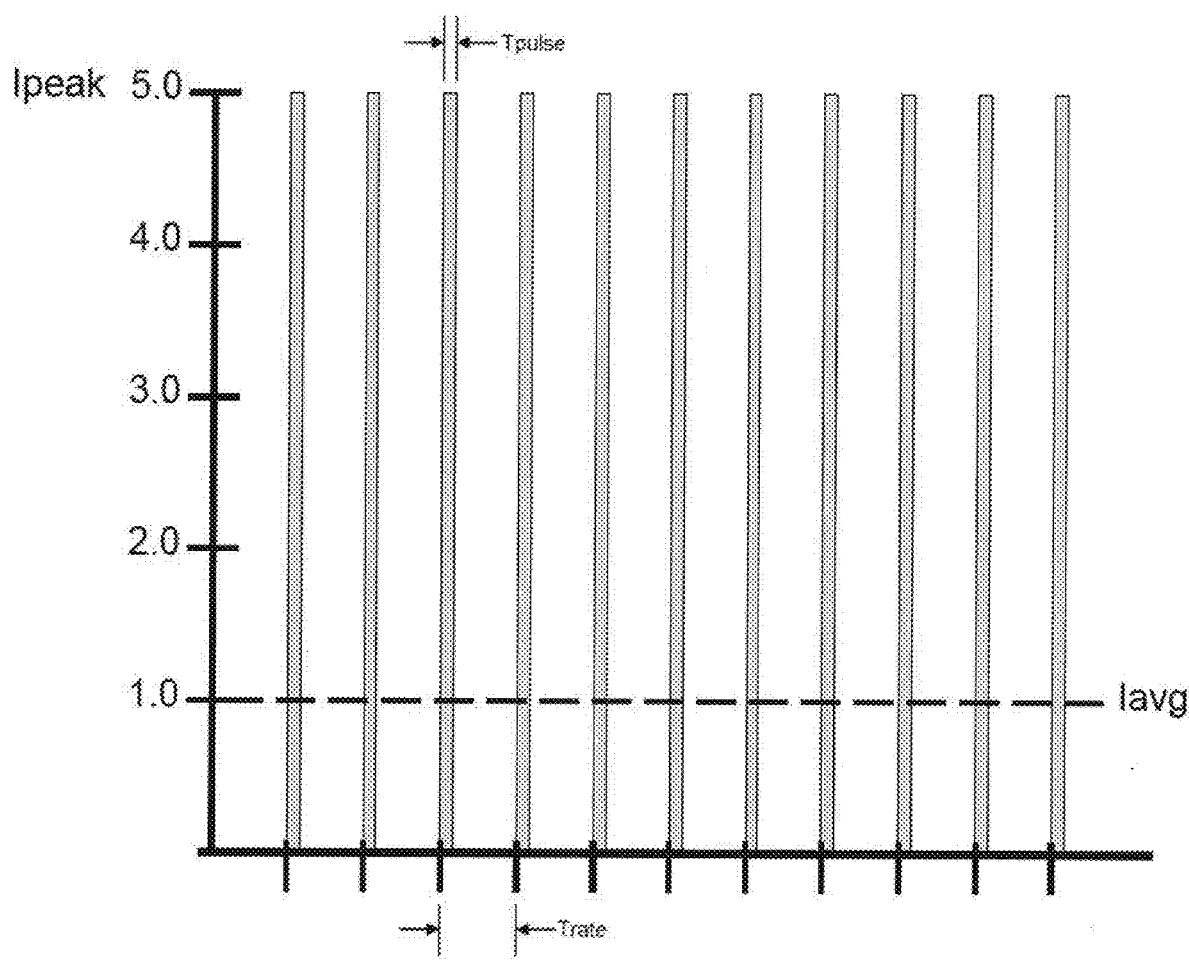
FIGS. 12A and 12B illustrate an example discharge pattern and a corresponding reference circuit, respectively.
Figure 12B:
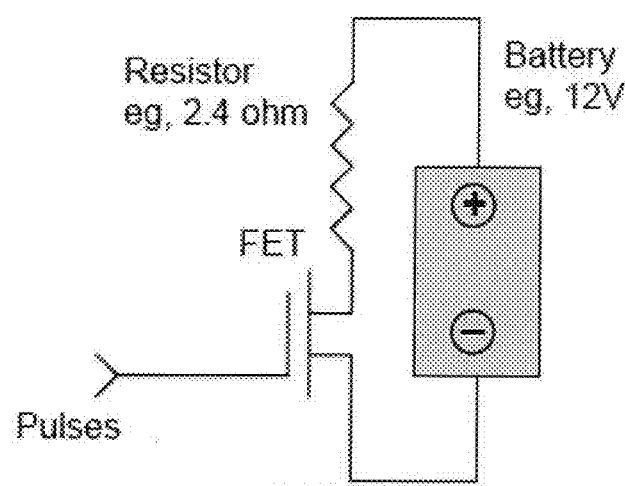

FIGS. 12A and 12B illustrate an example discharge pattern and a corresponding reference circuit, respectively. As shown in FIG. 12A, the discharge of current to equalize a battery may use a pulse-width pattern. The current may be discharged in pulses. Each pulse may have a duration (indicated as Tpulse). The collection of pulses may be each separated by a time (indicated as Trate). By adjusting the ration of Tpulse to Trate the average discharge current (Iavg) may be controlled. For example, as illustrated, 0.2 ratio would set a 1 amp average with a 5 amp peak.

FIG. 12B illustrates an example reference circuit from which the peak and average current discharge may be calculated. The pulses may be generated by driving a FET that closes the circuit across a resistance and the battery. The duration and frequency of the pulses may be used to vary the rate at which current is discharged from the battery.

While systems and methods have been described and illustrated with reference to specific embodiments, those skilled in the art will recognize that modifications and variations may be made without departing from the principles described above and set forth in the following claims. For example, it is understood that the described embodiments can be implemented using a single sensor device that may monitor and/or manage a single battery or a single sensor device that may monitor and/or manage multiple batteries. Accordingly, reference should be made to the following claims as describing the scope of the present invention.

What is claimed is:

1. A method for monitoring the health of, and adjusting the charge of, a battery in a string of batteries, wherein there is a sensor associated with each battery, each sensor being in communication with a controller, the method comprising:
   via each sensor and at each battery, obtaining an indication of the battery voltage, and also applying a pulse width modulated (PWM) excitation signal, and based on a battery response to the application of the excitation signal, determining at least one non-voltage health characteristic of each battery and providing an indication of the health of the battery;
   at the controller, receiving from each sensor the health indications and the indication of battery voltage;
   calculating, according to an algorithm carried out by the controller, a target battery voltage for each battery in the string based on the battery voltage indications;
   based on the calculation, sending, from the controller to one or more selected ones of the sensors, one or more discharge instructions; and
   at each selected sensor, generating a variable digital signal having pulse widths that are based on the discharge instruction and applying the variable digital signal to a current switching device operatively coupled across the battery so as to discharge the battery until the target battery voltage has been attained.

2. The method as recited in claim 1, wherein each battery in the string of batteries is a lead-acid monobloc.

3. The method as recited in claim 1, wherein each battery in the string of batteries is a lead-calcium monobloc.

4. The method as recited in claim 1, wherein the target battery voltage is a mean battery voltage associated with the string of batteries.

5. The method as recited in claim 1, wherein each discharge instruction is indicative of an optimum discharge current for one of the batteries.

6. The method as recited in claim 1, wherein each discharge instruction is indicative of a maximum discharge time for discharging one of the batteries.

7. The method as recited in claim 1, further comprising providing an indication of a condition of each battery based on a frequency of discharge instructions sent to the sensor associated with the battery.

8. The method as recited in claim 7, further comprising transmitting an alarm signal when the frequency of the discharge instructions exceeds an alarm threshold.

9. The method as recited in claim 1, wherein the indication of the health of each battery comprises at least internal admittance.

10. The method as recited in claim 1, wherein a characteristic of each discharge instruction is based on a difference between the indication of battery voltage associated with the battery and the target battery voltage.

11. The method as recited in claim 1 wherein the variable digital signal is a pulse width modulated (PWM) signal, and defines a PWM discharge signal.

12. The method of claim 11 wherein, at selected time intervals, the PWM discharge signal has a non-varying duty-cycle so as to cause a steady state discharge current at the battery.

13. The method as recited in claim 1 wherein the PWM signal is a relatively high frequency signal that represents a relatively low frequency sinusoidal when applied to the battery.

14. The method as recited in claim 1 further comprising providing to the controller via each sensor information indicative of its location in the string.

15. The method as recited in claim 1 wherein each sensor further comprises control circuitry for the switching device, and wherein, within each sensor, the same switching device and control circuitry are employed to apply the excitation signal to the battery and to variably discharge the battery.

16. A system for monitoring the health of, and adjusting the charge of, one or more batteries in a string of batteries comprising a controller and a plurality of battery sensors, there being a sensor associated with each battery, each sensor obtaining an indication of the voltage of its associated battery and having a current switching device operatively coupled across its associated battery and control circuitry for applying a pulse width modulated (PWM) excitation signal to its associated battery via the current switching device, each sensor determining at least one non-voltage health characteristic of each battery based on a battery response to the application of the excitation signal, and providing an indication of the health of the battery, each health indication being provided to the controller, the controller further being adapted to: (i) receive from the sensors the battery voltage indications; (ii) calculate, according to an algorithm, a target battery voltage for each battery in the string based on the battery voltage indications; and, (iii) based on the calculation, send one or more discharge instructions to one or more selected ones of the sensors; each sensor being adapted to generate a variable digital signal having pulse widths that are based on the discharge instruction and to apply the variable digital signal to the current switching device so as to variably discharge the battery until the target battery voltage has been attained.

17. The system as recited in claim 16, wherein each battery is a lead-acid monobloc.

18. The system as recited in claim 16, wherein each battery is a lead-calcium monobloc.

19. The system as recited in claim 16, wherein each discharge instruction is indicative of a maximum discharge time for discharging one of the batteries.

20. The system as recited in claim 16, wherein the discharge instructions cause a selected battery to discharge until the voltage of the battery is equal to the target battery voltage.

21. The system as recited in claim 16, wherein the indications of battery voltage are wirelessly transmitted to the controller.

22. The system as recited in claim 16, wherein the sensor is in the battery.

23. The system according to claim 16 wherein the variable digital signal is a pulse width modulated (PWM) signal, and defines a PWM discharge signal.

24. The system of claim 23 wherein, at selected time intervals, the PWM discharge signal has a non-varying duty-cycle so as to cause a steady state discharge current at the battery.

25. The system according to claim 16 wherein each discharge instruction is indicative of an optimum discharge current for one of the batteries.

26. The system according to claim 16 wherein the controller is further adapted to provide an indication of the condition of each battery based on a frequency of discharge instructions sent to the sensor associated with the battery.

27. The system according to claim 26 wherein the controller is further adapted to transmit an alarm signal when the frequency of the discharge instructions exceeds an alarm threshold.

28. The system according to claim 16 wherein a characteristic of each discharge instructions is based on a difference between the battery voltage indication associated with the battery and the target battery voltage.

29. The system of according to claim 16 wherein PWM signal is a relatively high frequency signal that represents a sinusoidal signal when applied to the battery.

30. The system of claim 16 further wherein each sensor provides to the controller information indicative of its location in the string.

31. The system of claim 16 wherein each sensor further comprises control circuitry for the switch device, and wherein, within each sensor, the same switching device and control circuitry are employed to apply the excitation signal to the battery and to variably discharge the battery.

* * * * *